United States Patent [19]

Smith et al.

[11] Patent Number: 5,267,322
[45] Date of Patent: Nov. 30, 1993

[54] DIGITAL AUTOMATIC GAIN CONTROL WITH LOOKAHEAD, ADAPTIVE NOISE FLOOR SENSING, AND DECAY BOOST INITIALIZATION

[75] Inventors: Shawn W. Smith, Santa Barbara; Mark Cromack, Santa Ynez, both of Calif.

[73] Assignee: Digital Sound Corporation, Carpinteria, Calif.

[21] Appl. No.: 806,763

[22] Filed: Dec. 13, 1991

[51] Int. Cl.$^5$ .............................................. H03G 3/00
[52] U.S. Cl. ...................................... 381/107; 381/94; 375/98
[58] Field of Search ......................... 381/105, 104, 94; 375/98

[56] References Cited

U.S. PATENT DOCUMENTS

| | | | |
|---|---|---|---|
| 3,588,705 | 6/1971 | Paine | 325/348 |
| 3,813,609 | 5/1974 | Wilkes et al. | 330/51 |
| 3,947,636 | 3/1976 | Edgar | 179/1 P |
| 4,112,384 | 9/1978 | Buchberger | 330/141 |
| 4,169,219 | 9/1979 | Beard | 179/100.3 R |
| 4,414,689 | 11/1983 | Enderson | 455/221 |
| 4,623,934 | 11/1986 | Taylor | 358/280 |
| 4,631,489 | 12/1986 | Laird et al. | 329/110 |
| 4,703,507 | 10/1987 | Holden | 381/94 |
| 4,747,065 | 5/1988 | West | 364/715 |
| 4,754,419 | 6/1988 | Iwata | 364/724 |
| 4,775,988 | 10/1988 | Chevillat et al. | 375/98 |
| 4,785,352 | 11/1988 | Borrowes et al. | 358/174 |
| 4,785,418 | 11/1988 | Pearce et al. | 364/715.01 |
| 4,859,964 | 8/1989 | Jorgensen | 330/279 |
| 4,879,729 | 11/1989 | Salembier et al. | 375/104 |
| 4,901,333 | 2/1990 | Hodgkiss | 375/98 |
| 5,016,205 | 5/1991 | Shumway | 364/715.01 |
| 5,029,162 | 7/1991 | Epps | 370/77 |
| 5,054,078 | 10/1991 | Schorman et al. | 381/110 |
| 5,063,931 | 11/1991 | Leavitt | 128/661.07 |
| 5,083,304 | 1/1992 | Cahill | 375/98 |

OTHER PUBLICATIONS

Lovrich et al., "An All Digital Automatic Gain Control," D8.18, 1988 IEEE, pp. 1734-1737.

*Primary Examiner*—Forester W. Isen
*Attorney, Agent, or Firm*—Christie, Parker & Hale

[57] ABSTRACT

An automatic gain controller for a digitized audio signal, comprising a buffer with a plurality of subframes. Each subframe contains digitized data samples of the signal, the subframes including at least one future subframe and a current subframe. Signal processing means (such as a DSP) is coupled to the memory for controlling gain of the audio signal represented by the current subframe in the buffer. The signal processing means includes means to control gain of the data samples using a stored program for computing a plurality of mean signal level values from the plurality of subframes, each mean signal level value in the plurality corresponding to one of the subframes. The program includes means for causing decay of gain on the signal represented by the current subframe when a first set of the mean values are each below a low threshold signal level. The program also has means for causing gain attack on the audio signal represented by the current subframe when a second set of the mean values are each above a high threshold signal level. The program also comprises means for shifting the data samples in one subframe in the future group into the current subframe for controlling gain of the audio signal after causing gain attack or decay. Thus, a voice messaging system under control of the program causes gain attack and decay on the audio signal represented by the subframes which attack and decay appear to occur without delay to a user of the audio signal. All control parameters are configurable. The AGC system is initialized using novel floor tracking and decay boost initialization methods which improve performance at the start of a call. Spike resistance can be set as high as desired.

25 Claims, 13 Drawing Sheets

SAMPLE PROTOCOL

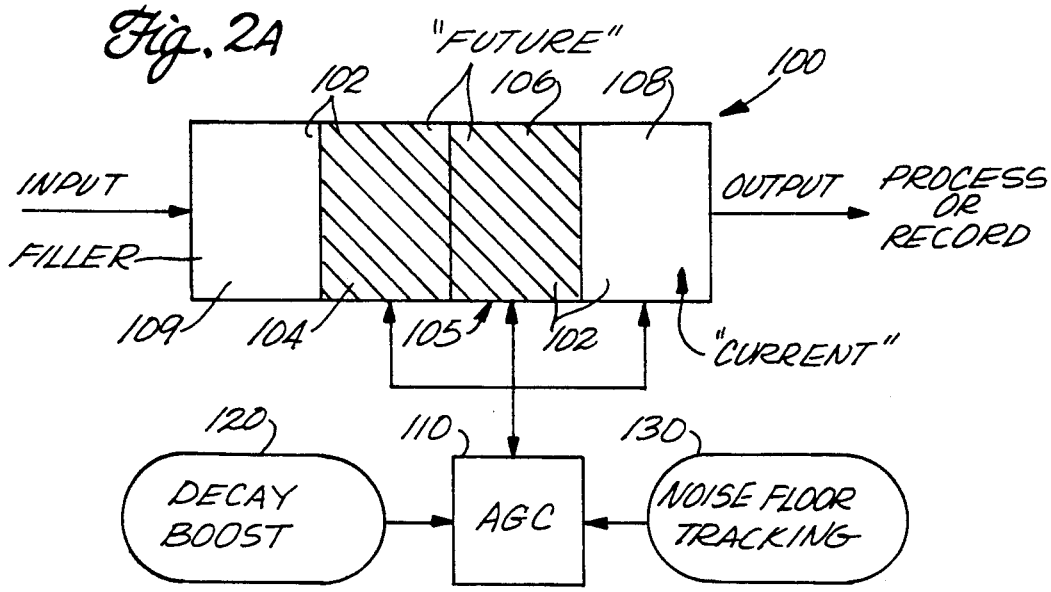
Fig. 2A
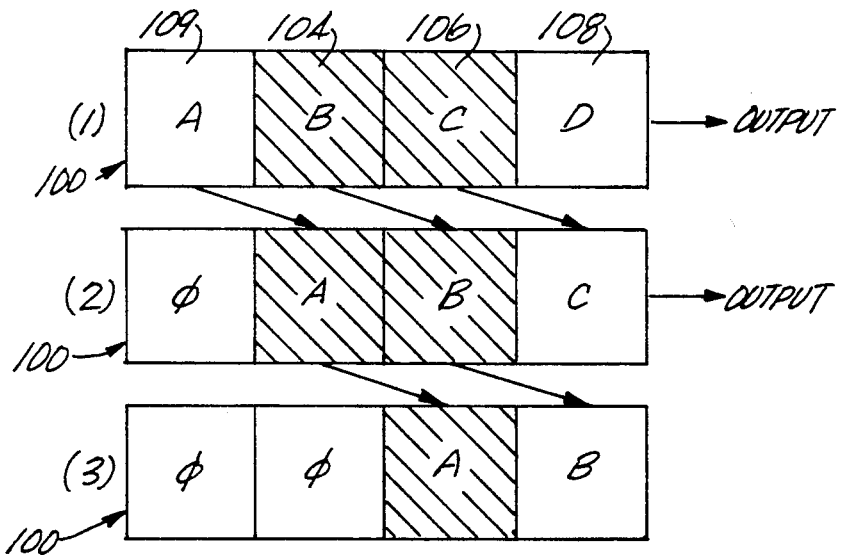
Fig. 2B
Fig. 6

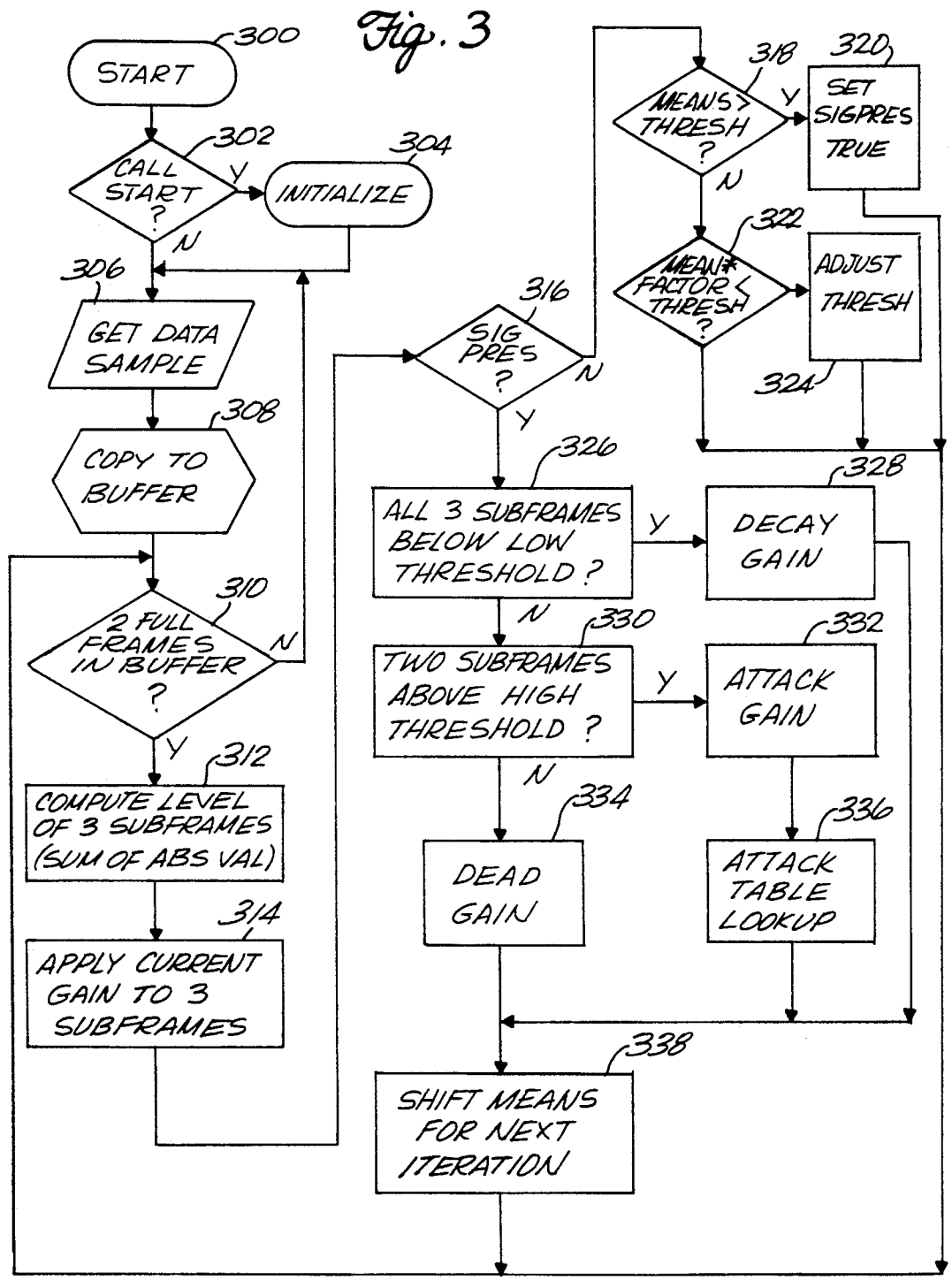

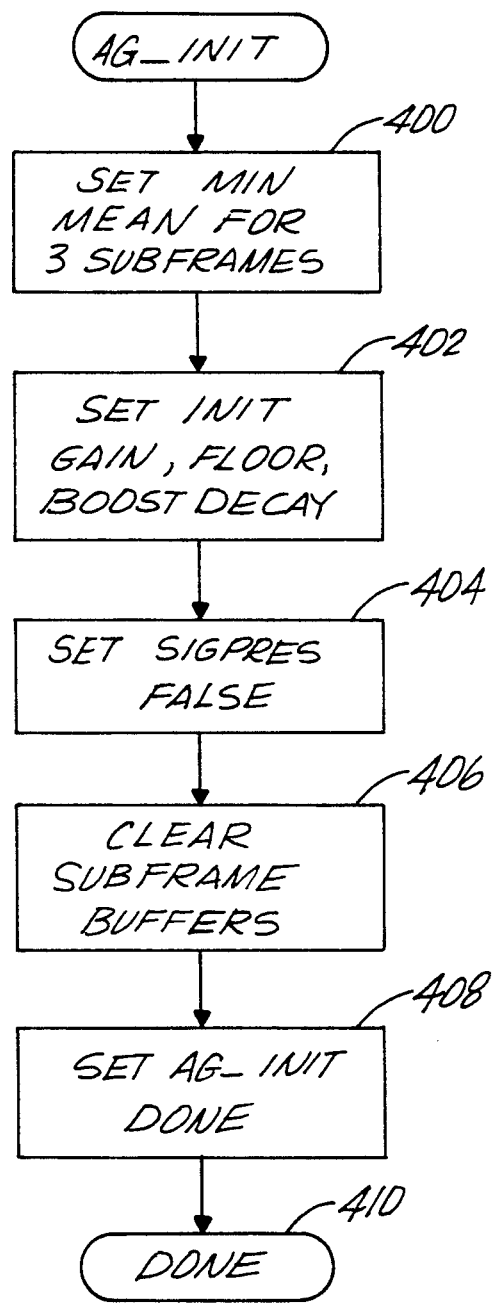

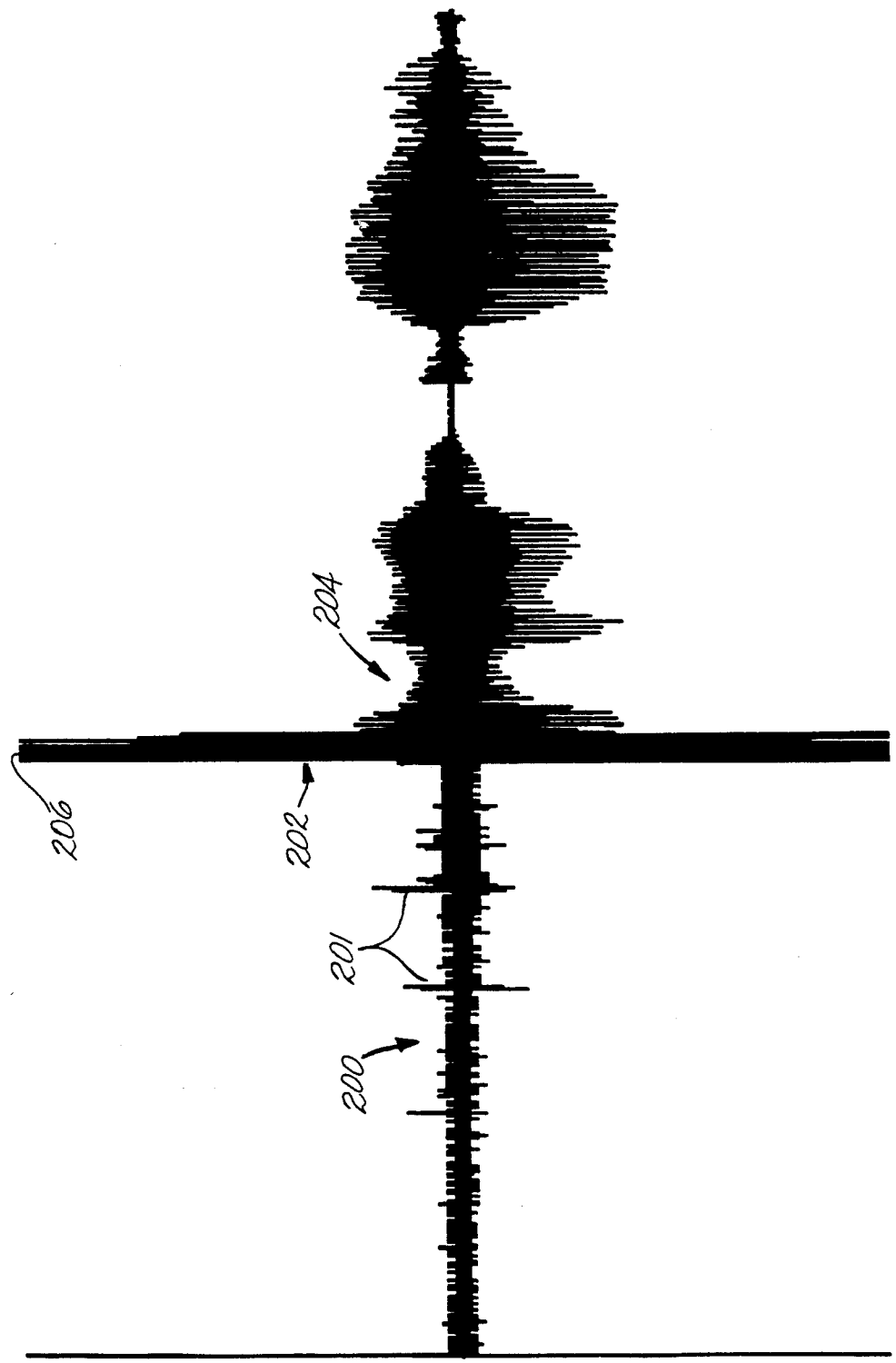

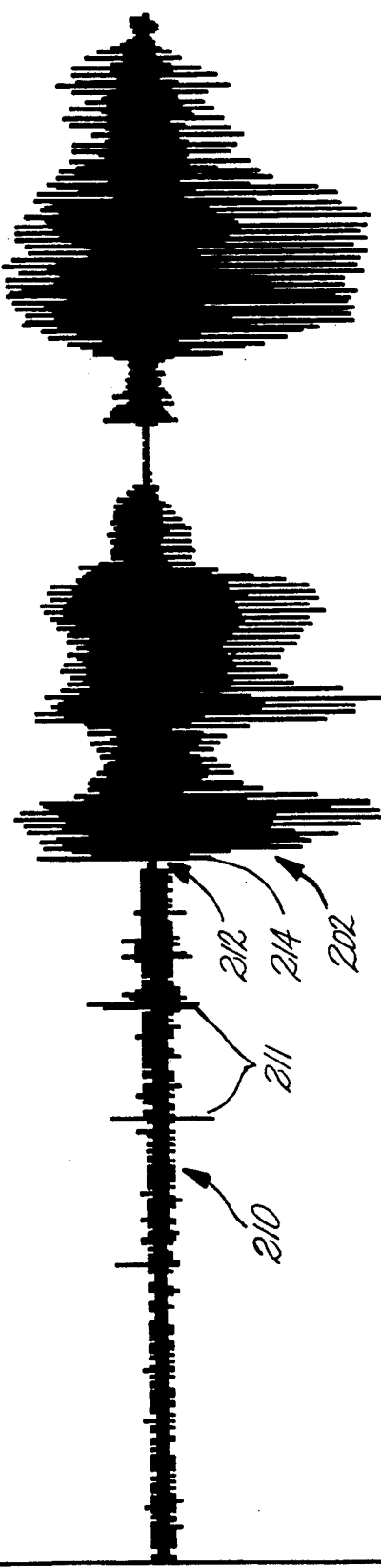

AGC INITIALIZATION WITHOUT FLOOR-TRACKING
(PRIOR ART)

AGC INITIALIZATION WITH FLOOR-TRACKING

AGC INITIALIZATION WITHOUT BOOST-DECAY
(PRIOR ART)

AGC INITIALIZATION WITH BOOST-DECAY

DIGITAL AUTOMATIC GAIN CONTROL WITH LOOKAHEAD, ADAPTIVE NOISE FLOOR SENSING, AND DECAY BOOST INITIALIZATION

FIELD OF INVENTION

This invention generally relates to digital techniques for automatic control of audio gain level. The invention specifically relates to automatic gain control of digitized audio signals using buffered lookahead techniques to achieve instant gain adjustment of the signal, in voice processing systems which are connected to the telephone network.

PROPRIETARY RIGHTS NOTICE

A portion of the disclosure of this patent document contains material which is subject to copyright protection. The copyright owner has no objection to the facsimile reproduction by anyone of the patent document as it appears in the Patent & Trademark Office file or records, but otherwise reserves all other copyright rights whatsoever.

BACKGROUND OF THE INVENTION

In call processing and voice messaging systems coupled to the public switched telephone network, automatic gain control (AGC) is used to control the amplitude of input signals before the signals are sent to a listener. A telephone can receive an extremely wide range of input signal levels, depending on the source of the call and the path taken through the telephone network. The input signal strength may also vary during a call due to actions by the calling party, or changes in the routing of the call through the network. A strong local call is often as much as 100 times "louder" than a weak long distance call.

AGC is used to adjust an input signal with large amplitude variations to a relatively constant listening level. However, AGC compensation must not interfere with content of the input signal. This is usually done by allowing an AGC apparatus to adjust the signal level fairly slowly in the upward direction. This slow increase in gain is referred to as "AGC decay", and the speed of increase in volume is called the "AGC decay rate." To prevent the input signal from becoming too loud, traditional AGC designs also allow for a very quick reduction in volume. This is called an "AGC attack", and the reaction time between the presence of an overly loud signal to the time that AGC adjusts the volume is called the "AGC attack time."

AGC can be implemented using analog electronic circuits, as exemplified by U.S. Pat. No. 4,112,384 (Burchberger). In such prior art circuits an amplifier with variable gain is placed in the input signal path, and feedback is used to control the amplifier output level with resistors and capacitors whose values determine the decay rate of the resulting circuit. The attack time is a function of the amplifier characteristics and the feedback circuitry.

Analog AGC circuits using feedback typically have slow attack times in the range of 5 to 15 milliseconds (ms). During this time too much gain is applied to the input signal, resulting in temporary audible distortion. A quick attack time results in fewer and less detectable AGC "attacks" during the course of a call. However, reduction of the attack time to less than 10 ms has adverse side-affects, such as causing the AGC to reduce the gain for the entire call in response to noise spikes, pops or clicks on the telephone line, even though the volume of input speech has not changed. The listener hears a sudden drop in the level of the call for no apparent reason. Thus, attack time and resistance to noise spikes trade off against each other in traditional AGC implementations.

A similar trade-off in AGC performance is found in the choice of a decay rate. A fast (large) decay rate allows AGC to rapidly adjust to changes in input signal strength. Fast decay is valuable when a caller switches from handset to speakerphone, and there is a sudden drop in the signal strength. Unfortunately, raising the decay rate too high can cause AGC to begin to distort the normal conversational rises and falls in volume level. Additionally, a high decay rate will generally cause more AGC attacks to occur, increasing the chances of audible distortion.

Traditional AGC designs take a fairly conservative approach in the choices of these parameters. An attack time is chosen that causes moderate distortion, but is fairly resistant to spikes. This is coupled with a slow decay rate, which causes few AGC attacks to occur (minimizing the number of 10 ms distortions in a call) but takes a long time to compensate for input level changes. Accordingly, those skilled in the art desire to have a configurable fast automatic gain control system to enable optimizing of these trade-offs.

AGC can also be implemented in digital circuitry for processing digitized samples of voice data, as exemplified by Lovrich, et al., "An All Digital Automatic Gain Control," published by IEEE as D8.18/CH2561-9/88/0000-1734 (1988). However, the high computational needs of prior digital automatic gain control implementations are a significant hindrance to use of these techniques when computation budgets are tight. For example, in a voice messaging system with AGC implemented in software for a digital signal processor (DSP) the DSP must perform many voice processing functions besides AGC. Very few DSP machine cycles are available just for AGC computation. Thus, those of skill in the art would appreciate an efficient implementation to allow other voice-band activity of significant computational cost to run concurrently with the AGC on the DSP.

U.S. Pat. No. 5,016,205 (Shumway) discloses a digital AGC for a DSP, but fails to solve all the problems addressed by this invention. Its buffer is just used for delay during time-consuming computing steps. One problem with Shumway and other digital AGC apparatus is failure to gracefully handle gain control at the start of a call or voice message (known herein as AGC initialization). Establishing a correct gain level at the beginning of a call in an acoustically pleasing way is difficult. If the gain is simply set to a predetermined or target gain level, users hear the sudden change in gain as a "click" sound, which is intrusive. One desirable goal of AGC is to be completely hidden from users so they never know it's there, they simply get pleasant listening levels all the time. Therefore, those of skill in the art would appreciate a digital DSP AGC which can imperceptibly apply gain control at the beginning of a call to eliminate sudden gain changes and clicks.

To properly set gain level, every digital AGC must distinguish background noise from valid speech, since more gain is required when the speech to noise ratio is low. However, noise characteristics of a telephone line can change dramatically during a call. One example is when a user in a noisy room suddenly switches from using a telephone handset to a speakerphone, causing a dramatic increase in background noise. Shumway and other prior art digital AGC apparatus fail to account for such noise level changes. Those of skill in the art would appreciate a DSP AGC which can adapt its noise level settings to change in ambient conditions as changes occur, and thereby dynamically optimize gain control performance.

Also, in the prior art, software AGC parameters (e.g. number of coefficients, various threshold parameters) are not completely configurable, i.e., the parameters cannot all be changed to other values while the messaging system is operational. This is a disadvantage since configurability can be used to "tune" the parameters to the desired level of performance for the available processing power and to match characteristics of the location or site of the system.

Also, the gain adjustment process in prior art AGCs under discussion requires time for attack or decay before the AGC reduces gain to the desired level. Since most AGC systems operate in real time, several milliseconds of perceptible voice data usually pass through an AGC before correct gain level is set, causing temporary audible distortion. This time may be kept to a minimum at a fairly high computational effort, but the attack time is never zero (instantaneous). Thus, those skilled in the art desire a digital AGC with instant or zero attack time for rapid gain control, without high computational overhead.

Those skilled in the art would also appreciate an digital software AGC canceller implemented on a general-purpose DSP which serves multiple channels of voice-band activity while using a minimum number of processor cycles for gain control.

SUMMARY OF INVENTION

Accordingly, this invention provides an automatic gain controller for a digitized audio signal, comprising a buffer with a plurality of subframes. Each subframe contains digitized data samples of the signal, the subframes including at least one future subframe and a current subframe. Signal processing means (such as a DSP) is coupled to the memory for controlling gain of the audio signal represented by the current subframe in the buffer. The signal processing means includes means to control gain of the data samples using means for computing a plurality of mean signal level values from the plurality of subframes, each mean signal level value in the plurality corresponding to one of the subframes. The controller includes means for causing decay of gain on the signal represented by the current subframe when a first set of the mean values are each below a low threshold signal level. The controller also has means for causing gain attack on the audio signal represented by the current subframe when a second set of the mean values are each above a high threshold signal level. The controller also comprises means for shifting the data samples in one subframe in the future group into the current subframe for controlling gain of the audio signal after causing gain attack or decay. Thus, a voice messaging system under control of the controller causes gain attack and decay on the audio signal represented by the subframes which attack and decay appear to occur without delay to a user of the audio signal.

Preferably the invention is implemented in a programmed computer in a voice-messaging systems. The voice messaging system includes analog or digital telephone line interfaces which provide digitized voice data to a DSP. The DSP processes digital voice data sampled in "frames" of sample points. During recording of a voice message, frames of voice data are continuously fed to the AGC and buffered. Two frames are buffered and available to the AGC, divided in four half-frame subframes. Gain adjustment is carried out on signal data in one subframe at a time, using signal data in two of the buffered subframes as context information. Thus, frames of data in the future are examined to make decisions about current gain level.

All control parameters are configurable, enabling site-specific performance optimization. The AGC system is initialized using novel floor tracking and decay boost initialization methods which improve performance at the start of a call. Spike resistance can be set as high as desired. The invention can be further understood with reference to the attached drawings:

BRIEF DESCRIPTION OF DRAWINGS

FIG. 1, including

FIG. 1A is a block diagram of the voice messaging system;

FIG. 1B is a block diagram of a line interface controller used in the system of FIG. 1A;

FIG. 1C is a block diagram of an arithmetic processing unit used in the controller of FIG. 1B;

FIG. 1D is a block diagram of a preferred data format used by the system of FIG. 1A;

FIG. 2A is a generalized block diagram illustrating one embodiment of the invention;

FIG. 2B is a diagram illustrating data shifting in the invention;

FIG. 3 is a flow diagram depicting the sequence of operation of an AGC control routine in a computer program for controlling the operation of one of the APV's this interface controller of FIG. 1B, and together form an embodiment of the present invention;

FIG. 4 is a flow diagram of the initialization routine used in FIG. 3;

FIG. 5A is a diagram of an exemplary digitized audio waveform after a prior art AGC attack without lookahead processing;

FIG. 5B is a diagram of the waveform of FIG. 5A after an AGC attack using lookahead processing of the invention;

FIG. 6 is a block diagram of a gain look-up table for use with the attack table look-up of FIG. 3.

DETAILED DESCRIPTION OF PREFERRED EMBODIMENTS

In the following detailed description of the preferred embodiments, specific terminology is used for the sake of clarity. However, the invention is not limited to the specific terms used, but includes all technical equivalents functioning in a substantially similar manner to accomplish a substantially similar result.

A. System Overview

Figure 1A:
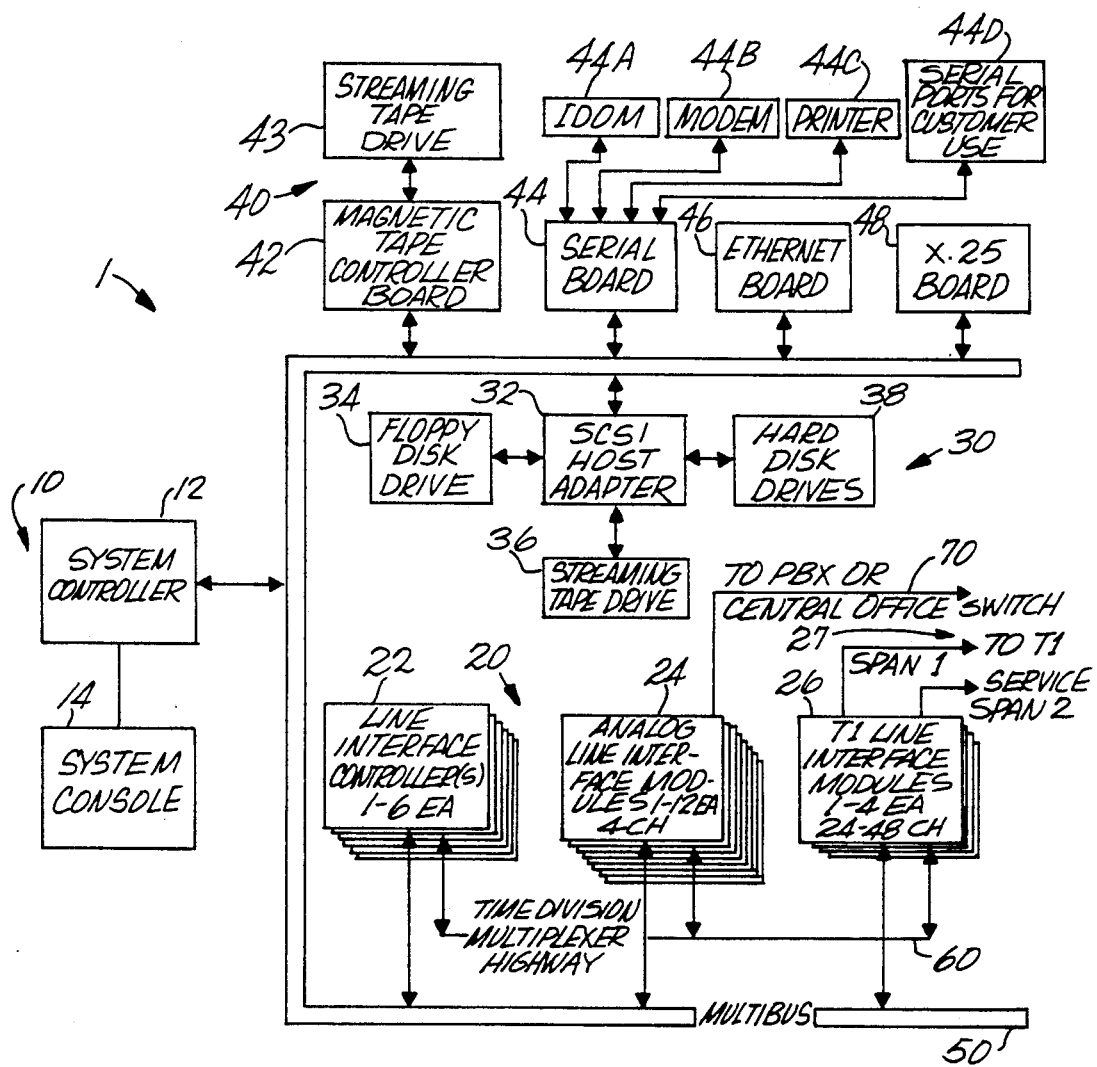
FIGS. 1A, 1B and 1C, depict a prior art voice messaging system, in which the present invention is implemented.

FIG. 1A shows a prior art voice messaging system 1 in which the lookahead automatic gain control (AGC) of the present invention is implemented. The system comprises control elements 10, telephone line interface elements 20, and peripheral interface elements 30, 40. These elements exchange data and control signals on a Multibus 50 which can follow the Multibus protocol developed by Intel Corporation. Multibus is a registered trademark of Intel. An independent bus 60, called a time division multiplexed (TDM) highway, enables fast transfer of digitized voice band data. The system preferably is the VoiceServer 2110 product commercially available from Digital Sound Corp., Carpinteria, Calif. The system is described in VoiceServer System Reference Manual, available from Digital Sound Corporation.

The control elements 10 include a system controller 12, which preferably is an Intel 386-class CPU with conventional support electronics, coupled to the Multibus and to a system console 14, containing a cathode ray tube (CRT) display and keyboard entry system of conventional type.

The telephone interface elements 20 include one or more analog line interface modules 24, which receive incoming calls on a public switched telephone line 70. As is known in the art, the analog interface modules digitize incoming call signals and assign the call to a channel in the system.

If incoming digital lines are available, such as lines following the T1 standard protocol, then one or more T1 line interface modules 26 of conventional design are provided to couple T1 lines to the digital elements of the system. As is known in the art, T1 interfaces provide voice communication at 1.544 megabits/second according to CCITT recommendations G.703 and G.704.

Figure 1B:
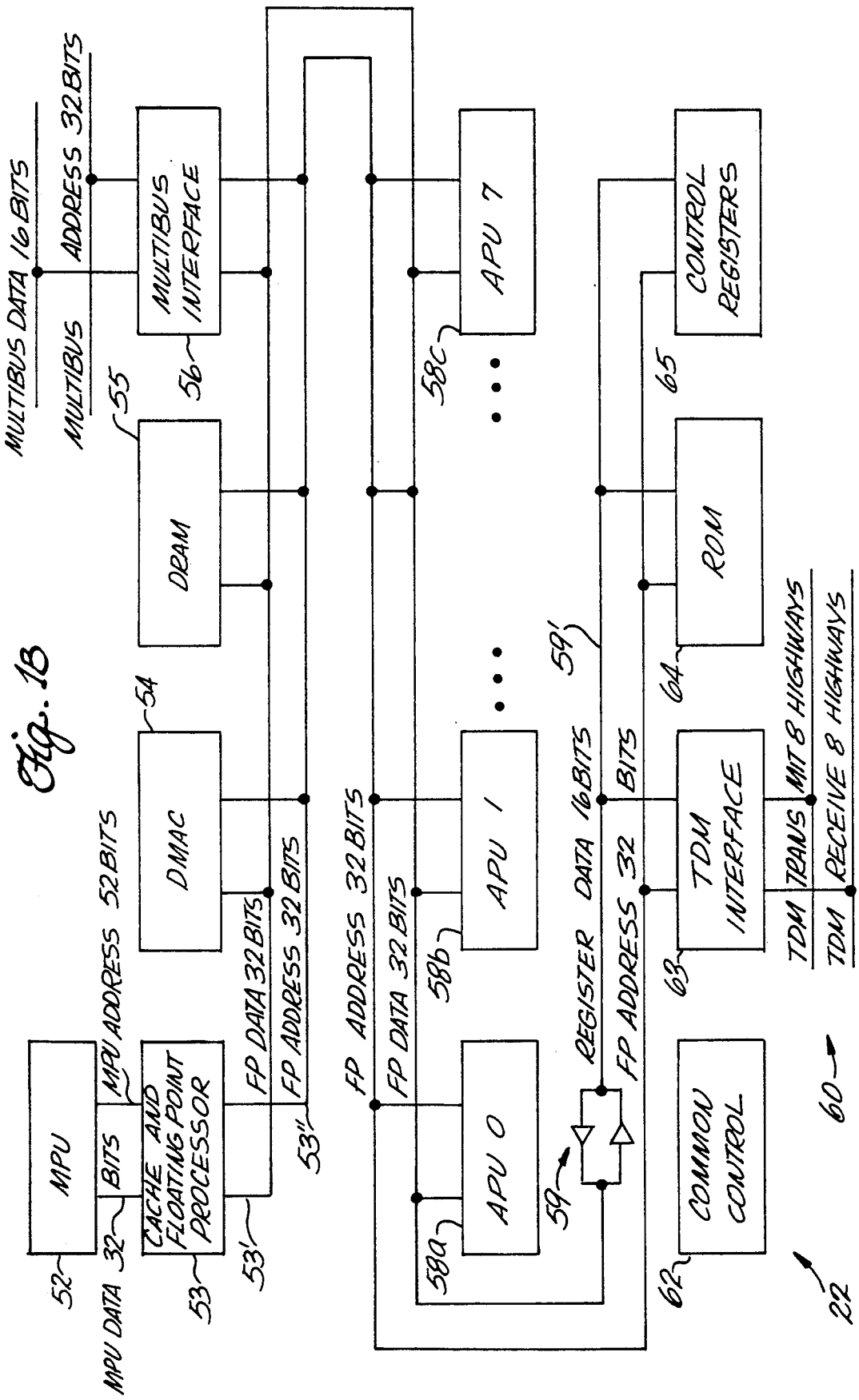
Figure 1C:
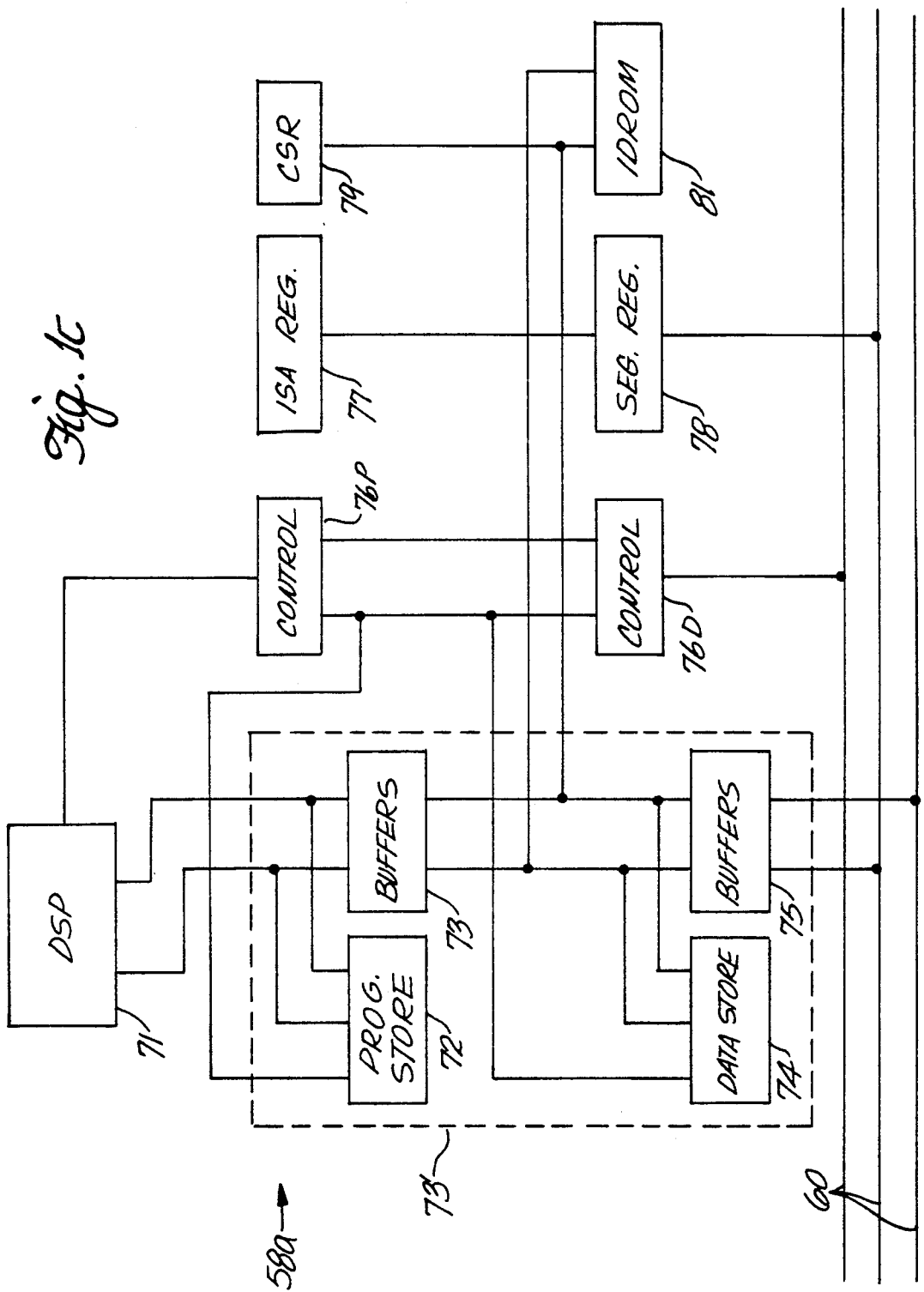
Figure 10:
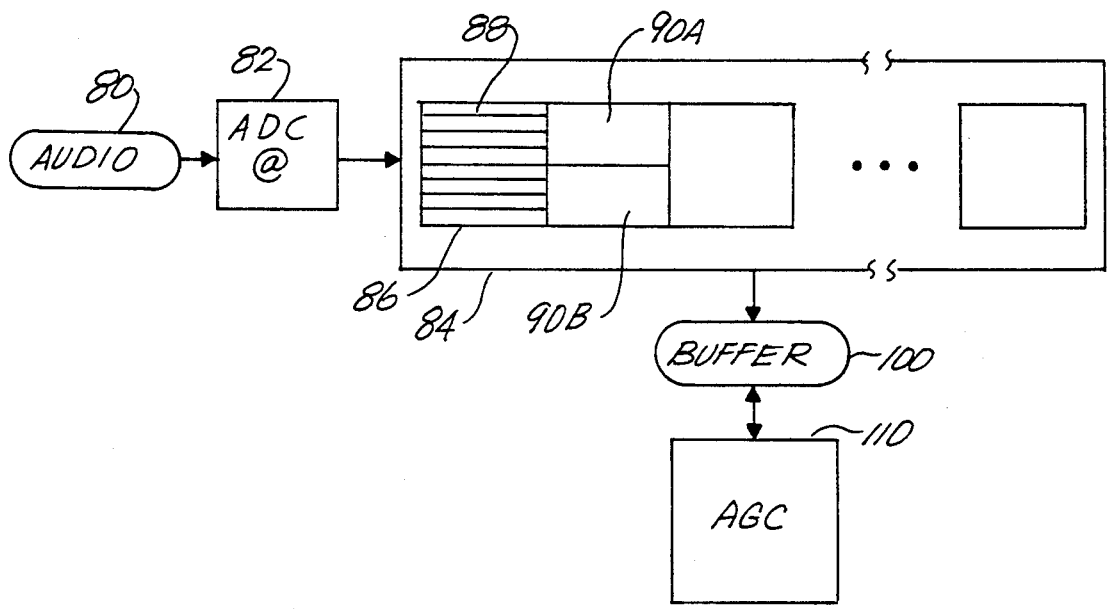

Digital signal processing of voice messages and control signals is done by one or more line interface controllers (LICs) 22 which are shown in detail in FIGS. 1B and 1C.

Referring to FIG. 1B, each LIC 22 preferably includes a complete conventional Intel 386-class microcomputer 52 (such as a type 80386 integrated circuit) coupled to a plurality of arithmetic processing units (APUs) 58a-58c each containing at least one digital signal processor Texas Instruments Inc.. In one preferred embodiment the microcomputer 52 is coupled to cache memory processor and a floating point processor 53 over 32-bit data and address buses. Output from the cache and floating point processors 53 are placed on 32-bit floating point (FP) data and address buses 53' and 53'' which are coupled to a direct memory access controller (DMAC) 54 which can be a type 82380 integrated circuit. Also coupled to the FP buses are up to 8 mbytes of dynamic random access memory (DRAM) 55, and preferably eight of the APUs. A bidirectional Multibus interface 56 couples the LIC FP buses to the Multibus, by multiplexing and connecting signals from the buses to each other. A data bus two-way transceiver 59, reduces the 32-bit FP data bus to a 16-bit bus 59 which is coupled to a read-only-memory (ROM) 64 and control registers 65. The transceiver is conventional and enables two-way communication of a 16-bit signal on either a 16-bit or a 32-bit data bus. A single block 62 represents several common control circuits for bus arbitration, address decoding, TDM highway watchdog timing, and decoding requests for access to on-board registers. A TDM interface 63 couples the FP address bus and the 16-bit data bus to TDM highway 60. The TDM interface decodes a serial data stream on the TDM highway and assigns serial bit blocks in the stream to one of the APUs on the FP bus. Two buses, in the form of TDM highway 60 and the FP buses, enable separation of voice data from control functions by providing a separate bus, the TDM highway, dedicated to digitized voice data. These components and their interaction are well known in the art.

An exemplary APU is shown in block form in FIG. 1C. Each APU contains a DSP 71, preferably the TMS320C25 of Texas Instruments Inc., coupled to a conventional memory having at least several kilobytes of storage in the form of a conventional electronic random access memory (RAM) 73. The RAM 73 preferably is divided into a program store 72 of preferably 32k words and associated program buffers 73, and a data store 74 (64k words) and data buffers 75. Control circuits 76P, 76D handle data interchange between the DSP and the memory. FP bus access is handled using registers 77, 78 and IDROM 81. A segment register (SEG REG) 78 extends 16-bit addresses from the DSP to 32-bit addresses used on the rest of the board. A command status register (CSR) 79 couples i/o interrupts to and from the DSP, and also provides reset and hold bits for the DSP. A time slot assignment (TSA) register controls orientation of TDM highway serial data. The IDROM contains character data to identify the APU board so that the system controller can determine the system configuration by reading the IDROM. The DSP preferably serves multiple channels of voiceband activity. The invention is preferably implemented in assembly code software on the DSP, as discussed in detail below.

Depending on the needs of the system user, a plurality of peripheral devices are interfaced to the system. For example, a Small Computer System Interface (SCSI) host adapter 32 are coupled to the Multibus and a streaming tape drive 36, a floppy disk drive 34, and one or more mass storage devices such as hard disk drives 38 can also be connected in known manner. The hard disk drives provide primary storage for voice data and can also provide storage for system software; via the Multibus, the disk drives are indirectly coupled to the DSPs on the LICs. Further, a magnetic tape controller board 42 is provided to interface the Multibus to a streaming tape drive 43. A serial communication interface board 44 can connect to a plurality of serial devices such as input/output distribution module (IODM) 44A, modem 44B, printer 44C, and user ports 44D. Further communications is provided using Ethernet board 46 and an X.25 board 48. Electronic and interface details of the elements designated 30 to 48 are conventional and well known.

B. DSP Operation

Each DSP in an APU on a LIC communicates with voice signals in a plurality of channels of data on the TDM highway. For each channel, at intervals equal to a predetermined sampling period (typically 8 KHz), the DSP receives a voice data sample value (receive data), and transmits a sample value (transmit data). Data reception and transmission occurs on the TDM highway.

As shown in FIG. 1C, voice data samples are obtained by the analog interface modules 24 which receive analog voice audio 80 from a telephone line on trunk 70. The audio is fed to an analog-to-digital converter 82 on the LIM 24 which samples the analog data at 8 Khz, the standard voice-band sampling frequency used in the telephone network. The samples are in linear 12-bit form, thus having a value represented by an integer ranging from −2048 to +2048. The sampled data is fed in a stream 84 from the LIM to the TDM highway.

By communicating through an APU on a LIC, the DSP receives and accumulates, over a fixed time period, a fixed number of receive digital data points 88 to form a receive "frame" 86 stored in a discrete area in the data store 74. Outgoing transmit data points are likewise accumulated to form a transmit frame in the data store. This period is called the frame duration and preferably comprises 180 sample points (88) representing 22.5 ms of voice data sampled from an audio signal.

Over a frame duration, the DSP processes the signals represented by the received frames and transmit frames, for each channel of activity, as directed by DSP software in the program store 72. The DSP can perform several different types of processing including speech encoding and decoding, companding, tone detection and generation, speech recognition, text-to-speech conversion, etc. All require DSP processing or computation. Thus, the frame duration determines the maximum total number of computations possible per frame of transmit and receive data.

The invention is preferably implemented on the system of FIG. 1A using a computer program for the DSP written in the C source language for which complete flow diagrams are provided herein. Preferably the C code is tested, debugged, and then hand-assembled into DSP assembler code, which is assembled and linked by the TMS302C2x DSP Assembler program commercially available from Texas Instruments. The assembled object code is stored on the hard disk drives 38 and loaded into DSP memory when the system is powered-up. Ordinarily the system remains on continuously so the software is always available in memory. Publications disclosing such DSP programming include "Second-Generation TMS320 User's Guide," No. 1604907-9702 (June 1989) and "TMS320C1x/TMS320C2x Assembly Language Tools User's Guide," No. 1604908-9706, commercially available from Technical Publications Manager, Texas Instruments Inc., P.O. Box 1443, MS 640, Houston, Tex. 77001, the contents of which are hereby incorporated by reference.

C. AGC Structure & Operation

Structural arrangement of the AGC of the invention is best seen in FIGS. 1C, 2A, and 2B. FIG. 3 illustrates logical flow of operation of the processing method of the invention. Specific structure and features of the AGC are discussed below, followed by an operational discussion.

Referring to FIG. 1C, a stream of frames is received from the TDM highway 60 by a DSP on one of the APUs and stored in a buffer memory area 100 in the data store 74. The AGC 110 of the invention can be implemented as one part or module of a larger DSP software program residing in the program store 72 of an APU on the LIC. Thus, the AGC 110 is coupled to the buffer 100 in the data store 74. As illustrated in FIG. 2A, the buffer 100 preferably holds two frames and is organized as four subframes 102 which each hold 90 points of data representing voice signals. Thus a total of two 180-point frames, or 360 data points, are available for AGC processing at all times. The four subframes are designated as a current subframe 108, two future subframes 104, 106, and a filler subframe 109. The buffer is a first-in first-out (FIFO) right-shiftable buffer. Thus, the current subframe 108 is called "current" because adjustment of signal data stored therein (gain adjustment) is the focus of AGC activity at any given time, and because after AGC adjustment the signal data in the current subframe is immediately output as described below. The future subframes 104 and 106 are called "future" because signal data therein is output after the current frame and therefore will be heard by a user, or processed downstream, in the future. The filler subframe 109 is provided simply to enable the four subframes of the buffer to be filled with two regular full-frame signal data transfers. In an alternate embodiment, the filler subframe can also be used as an additional future data subframe.

Each subframe of the buffer preferably is implemented as a 90-word array in the data store. If the TMS320C25 DSP is used, and extra speed is desired, then the buffer can be set up in on-chip RAM in the DSP (of which 344 words are available in the TMS320C25).

During initialization the buffer 100 first receives two new full frames which fill the four subframes of the buffer. During processing, the buffer is filled with new signal data using a fill process shown in FIG. 2B. Initially data is placed in the four subframes containing signal data A, B, C, D are in the filler, future, and current subframes as shown in FIG. 2B(1) Subframe 108 with signal data D is current; subframes 104, 105 with signal data B, C are future data used for reference; and subframe 109 with signal data A is filler data which is unused.

After AGC adjustment of the current subframe, the current signal data D is shifted right and output. When signal data is output it can be stored in the data store for further processing by another program, or can be sent to a digital to analog converter on the LIC or LIM for conversion to an audible signal. After the current signal data is output the buffer has the data configuration of FIG. 2B(2). Simultaneously signal data A, B, and C are shifted right to subframes 104, 106, 108 respectively, so that signal data C is current and A and B are future data. Since signal data A has been shifted to future subframe 104, filler subframe 109 is set null or zero and is unused.

After AGC adjustment signal data A, B, and C are shifted right to subframes 106, 108 and to output, resulting in the positions of FIG. 2B(3). Since one of the future subframes 104 is now null, i.e., contains no valid signal data, it is meaningless and cannot be used as reference data. Therefore, a new full frame of signal data is placed in subframes 109, 104 by the AGC, concurrently with the right shift.

Thus, at every other 90 point subframe, a fresh 180 points of data is placed into the buffer to be used first as filler and future data, and eventually to have gain applied to it and sent as output. An output frame can be stored in the data store for further processing by another program. Alternatively, an output frame can be sent as a transmit frame on the TDM highway to a digital to analog converter on a LIM for conversion to an audible signal.

Use of the buffer causes a delay of 22.5 milliseconds (one frame) in all data passed through AGC. In one preferred embodiment, this AGC system is used for the making of voice recordings, in which delay is not a performance issue since recording does not occur in real time. If AGC is used in a live environment, e.g. during a real time telephone call, a silent pause at the beginning of a call of less than 1/44th of a second occurs, but this pause is not generally noticeable by humans.

The logical flow of FIGS. 3 and 4 depict the sequence of operation of a control program or module carrying out automatic gain control using the buffer shown in FIG. 2A and using the hardware shown in FIGS. 1A, 1B, and 1C. The method of FIGS. 3 and 4 accomplishes the basic functions of an analog AGC circuit, but with much higher performance levels. A major concept change, future subframe processing or "lookahead", is used to attain increased performance, and the remaining AGC parameters are adjusted to account for new trade-off conditions. In the "lookahead" feature, data in the "future" is examined to make decisions about gain level. The lookahead feature allows attack time to be reduced to zero while spike resistance is set as high as desired. Several additional enhancements to be discussed have been made to initialization of AGC. Also, the method of the invention substantially reduces the number of machine cycles required for AGC processing, by using table lookup, an absolute value calculation instead of a root mean square calculation, and by performing AGC only after detection of speech.

Referring to FIG. 3, the control program or method starts at block 300 when a new telephone call or voice message is fed to a DSP 71 (FIG. 1C) on the TDM highway 60. During block 302 the DSP tests whether a new call is starting, and if so, control is passed to step 304 which initializes the method using the steps of FIG. 4, which can be a C language subroutine called by the routine of FIG. 3.

In block 400, program variables representing current and future subframes are each set to a value representing a minimum mean signal level. Preferably the value is 3 and represents 9.5 dB. Depicted below is a preferred data format for each of the 90 points in a subframe, and a gain format for program variables storing gain values:

```
           null    value              int    frac
    data  |      |      |     gain  |      |       |
    bits     4      12                  6      10
```

As shown, both data and gain preferably are stored as 16-bit words. For data points the most significant four bits (nul) are unused and the least significant 12 bits (value) hold a 12-bit linear data point. Gain words are represented using a simulated floating point format. The preferred DSP cannot directly execute floating point operations. Therefore, a 16-bit integer is divided as shown above into integer (int) and fractional (frac) portions. The bit length of each portion is chosen so that the integer portion can accommodate the largest integer needed, i.e. about 100, with the fractional portion occupying the remainder.

In step 402 program variables representing initial gain, noise floor level, and boost decay rate are set to predefined constants. The following constant parameters are preferred:

| Preferred Name | Preferred Value | Definition |
| --- | --- | --- |
| AG_M12DBM | 0×0127 | −12 dBm (295) |
| AG_M14DBM | 0×00eb | −14 dBm (235) |
| AG_M20DBM | 0×0076 | −20 dBm (118) |
| AG_M35DBM | 0×0015 | −35 dBm (21) |
| AG_ANASIZE | 180 | samples per frame |
| AG_SUBFRAMES | 2 | subframes per frame |
| AG_NUMSAMPLES | (AG_ANASIZE / AG_SUBFRAMES) | samples per subframe |
| AG_INTSHIFT | 6 | integer shift |
| AG_FRACSHIFT | 10 | fractional shift |
| AG_SSHIFT | 3 | scale shift for mean values |
| AG_SSDIV | 8 | scale shift expressed as divide |
| AG_UNITYGAIN | (1<<AG_FRACSHIFT) | unity gain |
| AG_INITGAIN | (3<<AG_FRACSHIFT) | |
| AG_THHIGH | AG_M12DBM*AG_NUMSAMPLES)>>AG_SSHIFT) | high threshold |
| AG_THTARGET | AG_M14DBM*AG_NUMSAMPLES)>>AG_SSHIFT) | target threshold |
| AG_THLOW | AG_M20DBM*AG_NUMSAMPLES)>>aG_SSHIFT) | low threshold |
| AG_THFFLOOR | AG_M35DBM*AG_NUMSAMPLES)>>AG_SSHIFT) | floor threshold |
| AG_FACTOR | 4 | bin factor for threshold |
| AG_DEF_DECAY | 200 | default decay rate (2.35 dB/sec) |
| AG_BOOST_DECAY | 32000 | boosted decay rate (310 dB/sec) |
| AG_MINMEAN | 90>>AG_SSHIFT | minimum mean (−60 dBm) |

Thus, to optimize performance of the invention any of the above constants can be changed and the program recompiled.

In step 404 a boolean variable SigPres (representing whether a valid speech signal is present on the line) is set false. Data in the subframe buffer 100 is cleared in step 406. In step 408 the C function name of the initialization function (or a boolean variable) is set to indicate that initialization has been completed. Control then returns via block 410 to block 306.

In block 306 one full data frame is fetched by the DSP 71 from the TDM highway 60 and copied to two subframes 109, 104 of the buffer 100 in block 308. Block 310 tests whether the buffer is full, i.e. whether two full frames are stored in the buffer. If not, control is passed back to block 306 to shift the signal data in subframes 109, 104 to subframes 106, 108, and fill the buffer by transferring a full frame to subframes 109, 104.

Otherwise, control is passed to block 312 during which the mean signal level is found for signal data in each of the two future and current subframes. Thus, three mean signal values are computed for the two future and current subframes 104, 106, 108. Each mean signal level is calculated by the DSP 71 as the sum of the absolute values of the 90 points in the future and current subframes 104, 106, 108. This sum of absolute values gives an estimate of the mean value over the frame of 90 points. Other methods of calculating the mean can be used; this method provides calculation efficiency and has been found to be equally accurate in establishing gain levels as the more intensive Root-Mean- Square (RMS) measure known in the art.

In step 314 the current gain value is applied to all three mean values. Applying the gain preferably is done by multiplying the gain level and the means. The result should be tested against a predetermined maximum level value to cause clipping if overflow occurs. Overflow can be tested, and clipping done, using the following code:

```
if ((gain>>16) > 0) {
    gain = oxffff;
}
```

In steps 316 to 336 the current gain value is adjusted up or down by adding or subtracting a program variable storing the gain value. However, no gain adjustment is done until the first valid speech sound appears in the buffer.

Valid speech is sensed by examining the subframe signal levels and looking for significant deviation from the background noise on the line, thereby implementing noise floor tracking 130. Deviation is found by adjusting a noise floor tracking variable (also called a valid speech threshold) to match the lowest input signal level for all encountered subframes. The operation is defined in blocks 318 and 322 of FIG. 3. Valid speech is:

A. Three consecutive 90-point frames with levels over and absolute level of 35 dBm; OR B. Three consecutive 90-point frames with levels that are +6 dB ABOVE the current noise floor level.

Due to the lookahead nature of the invention, three consecutive frames of data are examined, speech is detected and AGC initiated without losing any of the three frames of data. Prior art methods lose at least the first two frames before encountering the third and make a decision, because during the machine cycle required to decide, data is being output at the wrong level.

To detect valid speech, in step 316 the boolean SigPres is tested and if false (no valid speech signal yet found) control passes to step 318. If the signal level mean sum of the current subframe (computed in block 312) is greater than a predefined valid speech presence threshold value (the noise floor level), then valid speech is present and SigPres is set true in step 320. Otherwise, if the current subframe mean sum plus a predetermined factor is less than the current threshold, then the threshold is increased in step 324, thereby accomplishing noise floor tracking.

Preferably the valid speech presence threshold value is $-35$ dBm and any signal above this is always regarded as valid. Additionally, any signal which exceeds the local noise floor by a factor of preferably 6 dB is also classified as valid. Three consecutive valid subframes are required to set SigPres and thereby initiate AGC. The lookahead method of processing causes two of the required three subframes to be in the "future"; thus, the beginning of a signal is located with high accuracy and confidence. This requirement causes clicks and pops of less than 22.5 ms to not be mistaken as valid speech.

Once the beginning of speech has been detected, the invention uses a "boosted-decay" initialization 120, described below, to bring the gain to an appropriate level. To alleviate AGC engagement "click", AGC is turned on gradually with a very fast decay rate. This boosted decay rate is used until the first attack occurs. In application, gain rises smoothly over the course of at most six frames at which point the gain equals or exceeds the required level and an attack occurs. After this first attack, normal AGC operations begin with the standard decay rate. Since lookahead processing is in place, there is no danger of the extremely high initial decay causing an overload or distortion. The resulting sound is much less noticeable to the user; at worst, the first syllable of the first word is slightly muted as AGC rises.

To implement boost-decay initialization 120, once valid speech is found, control is passed to steps 326 to 332 in which a set of hueristics are run to decide how to adjust the current gain. The goal is to adjust the signal level of the current subframe to $-14$ dBm MEAN by adding gain to the signal at a rate of 400 dB per second. Maximum gain is achieved within 70 mSec of the detection of a valid signal.

To this end, in step 326, if all three subframes 104, 6, 108 in the buffer 100 contain signal level values below the low threshold (preferably $-25$ dBm), the gain is decayed in step 328. Gain decay is done by increasing the value of a program variable representing a gain value which is applied or multiplied to the value of the current subframe 108 block 314 as described above. Decay occurs to $-14$ dBm MEAN at a preferred rate of 2.35 dB/sec, which corresponds to a decay of 23.5 dB over a 10 second interval. This decay rate allows full gain to be applied to a suddenly faint signal in 15 seconds.

Otherwise, if two consecutive subframes among subframes 104, 106, 108 contain values representing signal levels above the high threshold (preferably $-12$ dBm), as tested in step 330, current gain value is adjusted to attack (preferably to $-14$ dbm) in step 332. To save computational steps, gain level selected for attack is preferably done by a form of table look-up. A gain table 600 shown in FIG. 6 is used. The table contains a plurality of mean value entries 604 and an equal plurality of corresponding gain entries 606. As shown in FIG. 6, the mean value entries M1, M2, ... Mn are each paired with a corresponding gain entry G1, G2, ... Gn. The table can also contain index entries 602.

Alternatively, the table can be implemented in a single-dimensioned array data structure (not shown). In such a structure successive mean value entries could appear at table locations $n+1$, $n+2$, $n+4$, etc. where n is an integer. Successive corresponding gain value entries would appear at $n+1$, $n+3$, $n+5$, etc. in the table. Thus, each mean value would be followed immediately by a corresponding gain value.

Since mean values and gain values are preferably represented using 16-bit numbers, the table might be prohibitively large unless a shorthand representation is used. To ensure that the table is no larger than necessary, a table generation program is preferably used with the following pseudocode (Copyright 1991 Digital Sound Corp.):

```
for (level = MIN_DBM, i =0; level<= MAX_DBM;
    level + = 1.0, i++) {
    mean    =   (double)AG_0DBM * pow(10.0,
    level/20.0) + 0.5
    sum = ((mean * AG_NUMSAMPLES) / AG_SSDIV);
    gain = AG_THTARGET / sum;
    tsum[i] = ((int)(sum+0.5));
    tgain[i] = (int)(gain * GFACTOR + 0.5); }
```

The identifiers "level," "mean," "sum," and "gain" are floating point variables and "tsum[]" and "tgain[]" are arrays for the table. The variable "level" is an indexing variable given values from a minimum audio level MIN_DBM to a maximum level MAX_DBM, which represent endpoints of the table. "Mean" is a mean power level computed as $$mean = (AG\_0DBM \times 10^{level/20}) + 0.5$$

"Sum" is the scaled sum of several mean samples found by multiplying "mean" by the number of subframe samples used in the buffer (AG_NUMSAMPLES) and dividing by a scaling factor. "Gain" is a gain level found by dividing a target gain level "AG_THTARGET" by "sum". In practice about forty table entries have been found adequate.

Using the table 600 gain level for attack is selected by finding a mean level entry in the table which matches the mean signal level sum found in step 312. In the preferred embodiment, a match is found when each of the mean signal level sums for the current subframe and the two future subframes is less than a selected mean level table entry, and greater than the previous entry. Strict equality is not needed and is impractical. When a match is found, a gain level in the table, corresponding to the selected mean level, is retrieved. The retrieved value is copied to a program variable representing the current gain level, to be used in applying gain in block 314.

If neither attack nor decay is indicated then control is passed to step 334 and the gain is unchanged.

The above three possible conditions maintain and adjust the gain level for the current subframe 108. Once the gain has been applied, the current subframe is shifted to output (step 338) and the future subframes are shifted forward 90 points, and the process is repeated. T h e following specifications are preferred for the invention (MEAN levels converted to RMS based on a 2 dB RMS to MEAN ratio):

| Attack time: | 0 ms (instant) |
|---|---|
| Decay rate: | 2.35 dB/sec |
| Max Gain: | 36.1 dB |
| Min Gain: | −15.9 dB |
| Low threshold | −20 dBm RMS (decay) |
| Target threshold: | −14 dBm RMS |
| High threshold: | −12 dBm RMS (attack) |
| Valid signal detection threshold | −35 dBm, or 6dB above floor |

The preferred desired average output level of the data is −12 dBm RMS as measured at tip-ring on the telephone line.

Thus, a system using the present invention has significantly higher performance than traditional feedback type AGC circuits or methods. The attack time is reduced to zero. Signal distortion is never allowed, because the gain is adjusted down for large signals at the exact instant they begin. This "perfect" attack is accomplished without sacrificing any spike resistance. Since high signal levels in signal data of two consecutive 90 point subframes are required to initiate an attack, spikes of less than 11.25 ms in duration will always be ignored. If additional spike resistance is required, more subframes of "future" signal data could be examined to make the decision, by changing the above constants. Thus, use of two future subframes serves as a variable spike resistance parameter. Two subframes are preferred to reduce data storage needs and to reduce the number of required DSP machine cycles.

The decay rate of the invention is 2.36 dB/second, which is fast compared to other AGC methods. The worst-case recovery time has been measured at only 15 seconds. This worst case is extremely unlikely to occur, and typical recovery times (e.g. when a user switches from handset to speakerphone) are about 5 seconds. This higher decay rate is possible because any resulting attacks will be inaudible, and because the decay will not occur improperly on brief drops in energy level which are common in human speech. Both of these facts are directly attributable to the "lookahead" concept pioneered herein.

The preferred embodiment also uses improved initialization techniques called "floor-tracking" and "decay-boost-initialization" 120, 130 shown in FIG. 1C. These features work together with the lookahead capability to substantially improve the performance of AGC in the first few seconds of a call. FIGS. 5A to 5F show the performance enhancements achieved by each of the three features of the invention (lookahead, floor tracking, boosted-decay-initialization) over a traditional AGC circuit.

FIGS. 5A and 5B show a typical section of speech where an attack is required. Plot 5A represents output of a system without a lookahead feature, but is otherwise similar to FIG. 5B. A long period of quiet speech 200 has allowed the gain to rise to a high level resulting in amplified background noise at the left side of the plot. Suddenly, the speech becomes much louder at a spike 202, and AGC must attack (reduce the gain quickly) to compensate. In the prior art, clipping occurs at point 206 for several milliseconds until gain is reduced at 204.

FIG. 5B shows how the invention processes the same speech envelope. The invention can cause gain adjustment for the sudden spike before outputting the spike data. Using the lookahead technique, gain is reduced at point 212 about two ms before the edge 214 of the spike 202. As a result, the gain level is adjusted at exactly the correct point to keep a pleasant listening level during recording or playback of the spike.

Figure 5C:
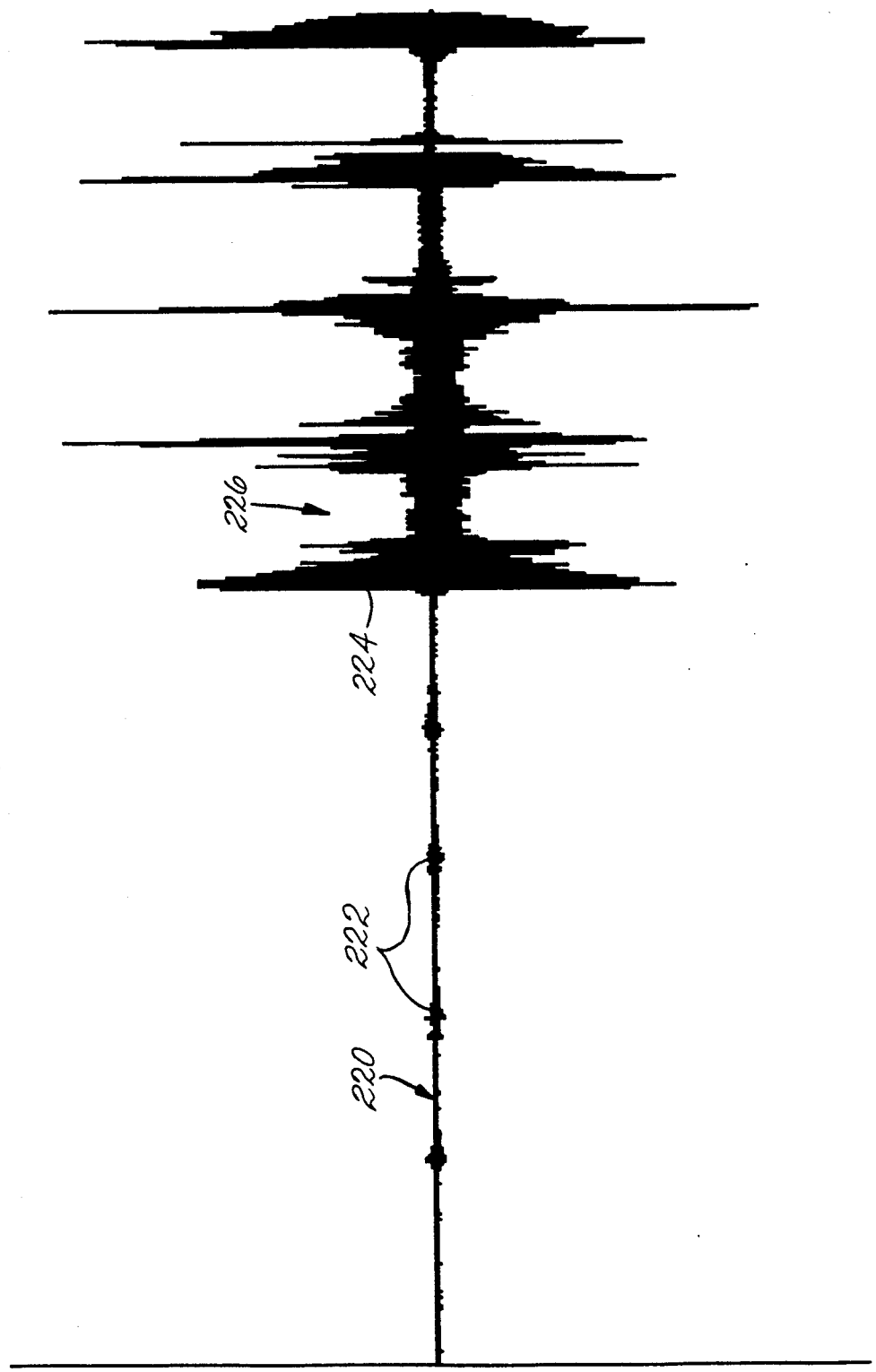
FIG. 5C is a diagram of an exemplary digitized audio waveform after prior art initialization.
Figure 5D:
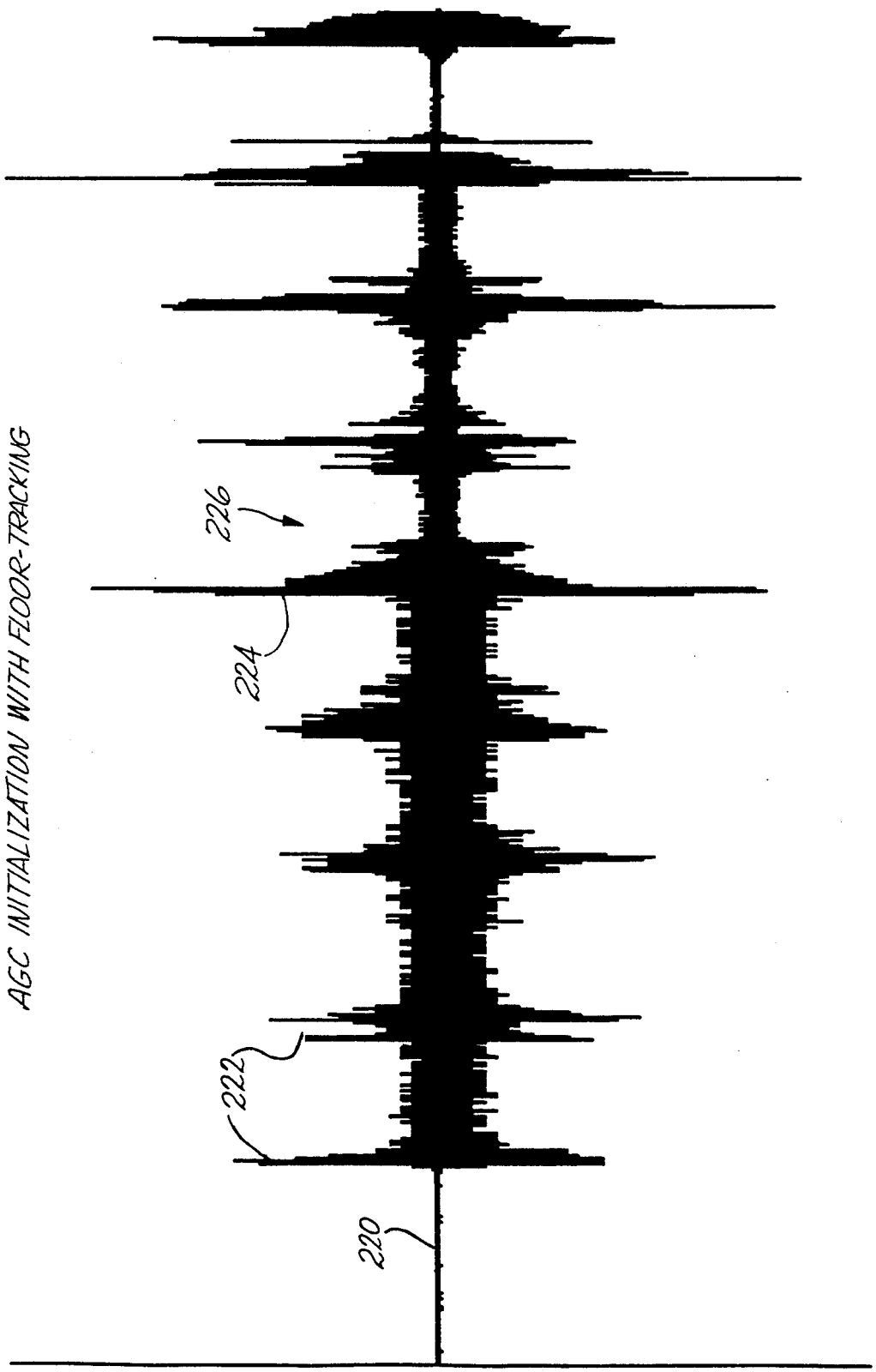
FIG. 5D is a diagram of the waveform of FIG. 5C after initialization with floor tracking according to the invention.

FIGS. 5C and 5D show sound envelopes of the first few seconds of a call. FIG. 5C shows prior art initialization which causes the first few words 222 to be far too faint relative to the noise level 220. Then AGC engages with a sudden jump in level for word 224 and downstream voice data 226.

FIG. 5D shows the same data processed with the floor-tracking feature of the invention. The first word 222 initiates AGC to establish an appropriate gain level.

Figure 5E:
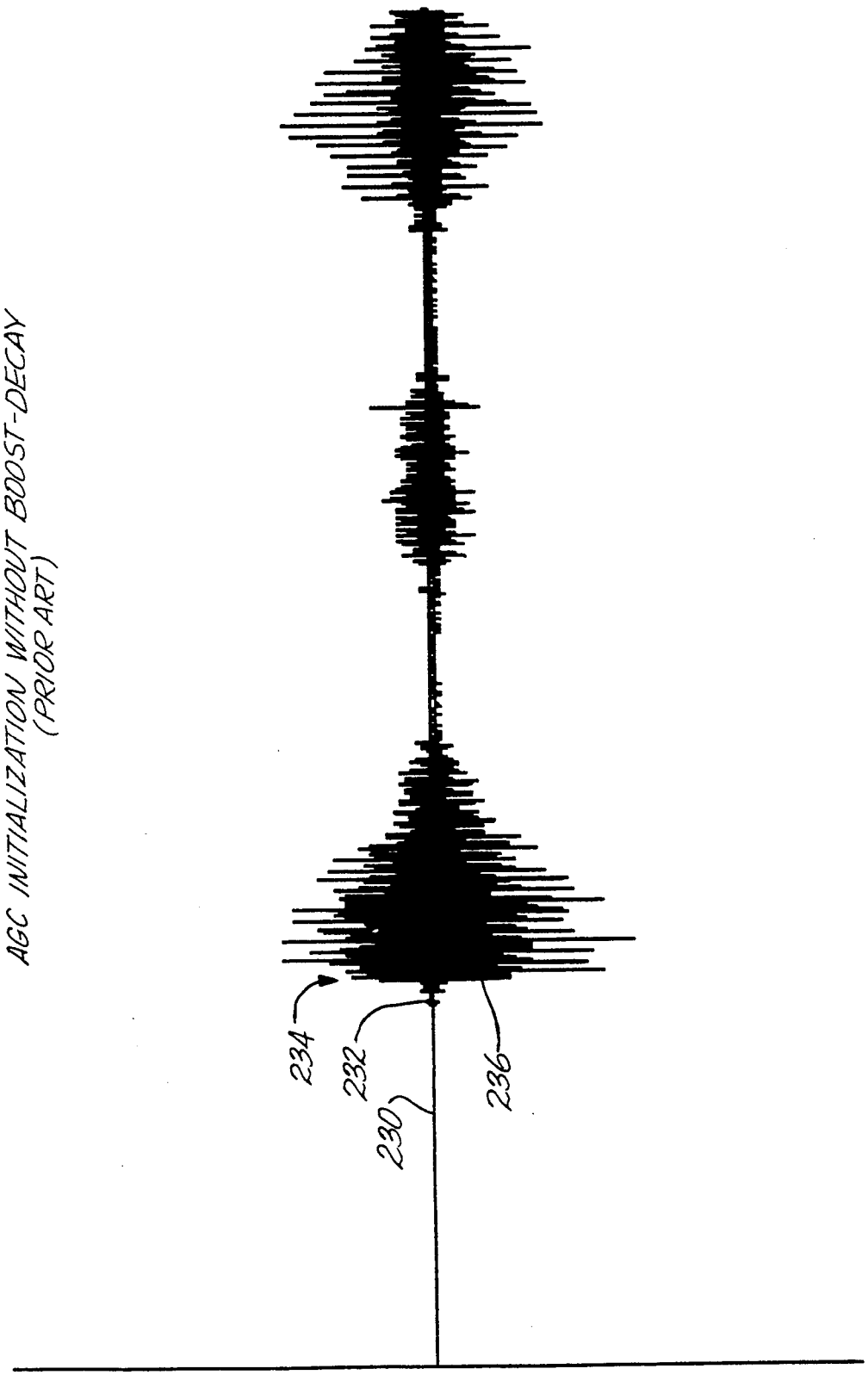
FIG. 5E is a diagram of an exemplary waveform after prior art initialization without boost-decay processing.
Figure 5F:
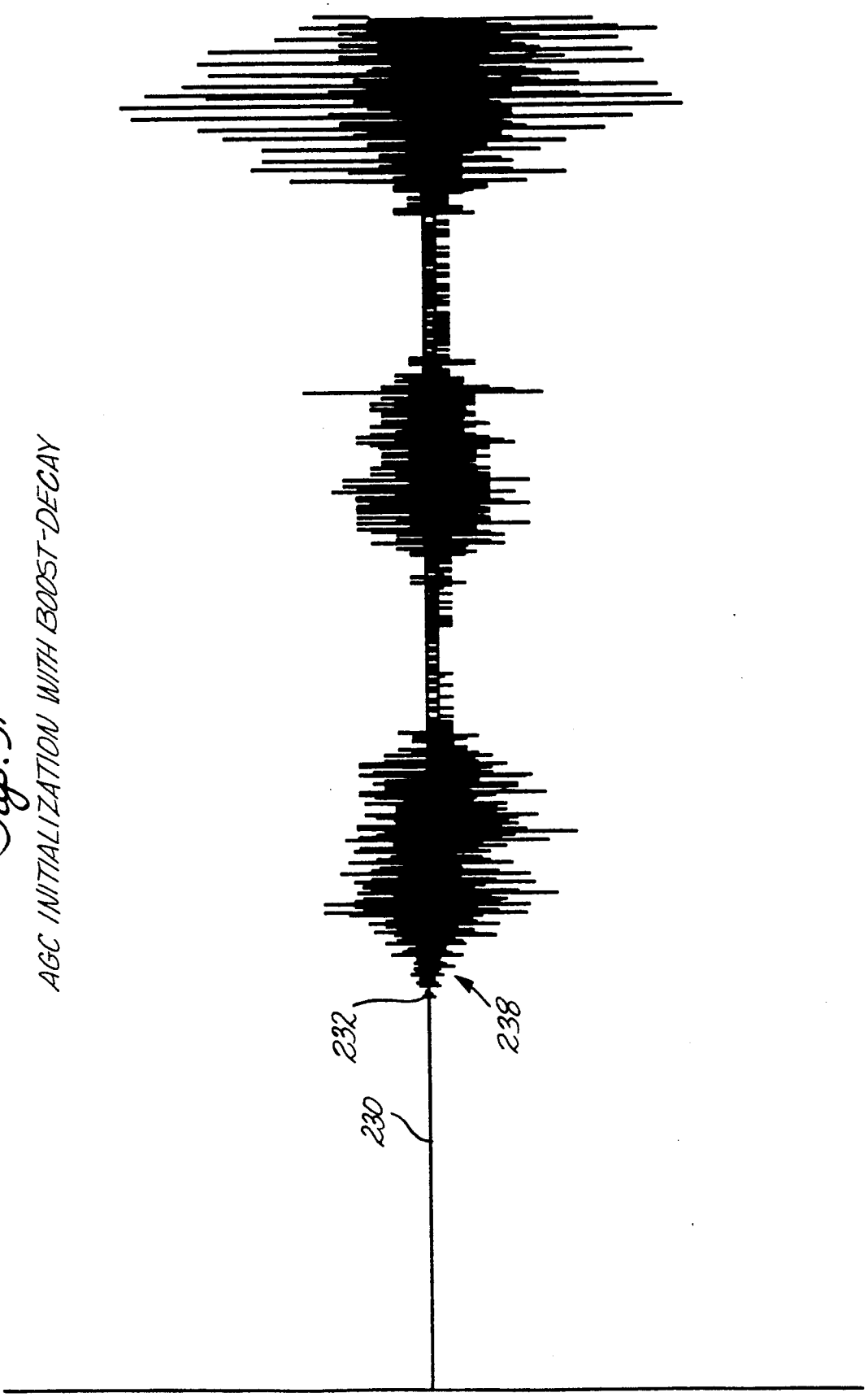
FIG. 5F is a diagram of the waveform of FIG. 5E after initialization using boost-decay processing according to the invention.

FIGS. 5E and 5F show the first few seconds of a faint call. FIG. 5E shows the call processed through AGC with prior art initialization. At the start of the call no signal is present at point 230. The call start occurs at point 232. A sudden jump in level occurs at point 236 as AGC is engaged for the first word 234. This jump is heard as a click and results from AGC suddenly changing the gain value when the call starts.

FIG. 5F shows the same data (and same initialization point), but with boost-decay-initialization applied as disclosed herein. From the start of the call at point 232, the voice signal (and AGC decay rate) rises smoothly along a ramp-like profile 238. As a result, the first part of the first word is boosted smoothly rather than instantaneously increasing in volume.

Thus, the invention provides automatic gain control for digitized audio signals with many advantages over the prior art. All these improvements are efficiently and concurrently executed through implementation in a DSP program. The invention would be extremely difficult to duplicate using analog circuitry.

By buffering data, it is possible to look at input information in the "near future" relative to where the gain is being applied. Having future information on which to base calculations allows for zero (perfect) attack time without compromising other parameters. Lookahead also allows better initialization of AGC, and more flexibility of decay rate.

By observing the lowest input signal level across a sequence of input data frames (floor tracking), it is possible to obtain an estimate of the background noise level on the telephone line. The estimate allows much finer tuning of thresholds designed to detect the presence or absence of speech. This feature is used in conjunction with lookahead to provide much more accurate AGC initialization points. Floor tracked initialization has superior detection of faint speech and equal noise resistance to traditional hard threshold techniques.

By modeling the initial engagement of AGC after an extremely high decay rate, the decay-boost-initialization feature avoids the intrusive "click" sound of AGC initialization.

The invention may be practiced in many ways other than as specifically described herein. For example, different quantities of taps can be used in the buffering functions depending on the desired degree of spike resistance. Many different hardware components can be substituted for those specifically disclosed herein. Thus, the invention should be given the full scope of the appended claims, in which:

What is claimed is:

1. A method for automatic gain control of digitized voice samples processed by a voice processing system having a memory, a digital signal processor coupled to the memory for executing the control program, and a buffer in the memory comprising a plurality of sample subframes organized as a group of future subframes and a current subframe; the method comprising the steps of:
   computing the total signal level of signals represented by all the subframes;
   causing gain decay on the signal represented by current subframe when a signal level of a first set of the subframes is below a low threshold signal level;
   causing gain attack on the signal represented by the current subframe when a signal level of a second set of the subframes is above a high threshold signal level;
   shifting the signal represented by the current subframe to an output for recording on the mass storage device and for shifting data of one subframe in the future group into the current subframe;
   initializating a gain level by the steps of
   setting an initial gain level of the control program, the initialization instructions being coupled to an attack level setting, a decay level setting, and a desired gain level setting in the memory, the initialization instructions comprising
   increasing the attack level setting by a small controlled amount during processing of each of a predetermined plurality of frames processed by the control program at the start of a frame stream;
   disabling the initialization means when the attack level setting equals or exceeds the desired gain level; and
   estimating background noise of the signal sample by setting a background noise level value in the memory and adjusting the noise level value in response to the lowest of the signal levels of a plurality of subframes.

2. The method of claim 1, wherein the steps for initialization are modified by an initial gain floor level estimate stored in the memory and further comprise the steps of
   detecting valid speech in the signal sample by sensing a signal level of the current subframe,
   adjusting the floor level estimate in response to the signal level of the current subframe, and
   finding valid speech when a plurality of consecutive subframes each have a signal level greater than the sum of the floor level estimate and an interval value.

3. The method of claim 2, wherein the steps for detecting valid speech further comprise a step in response to absence of valid speech of adjusting a noise floor threshold in the memory when the sum of the total signal level of a plurality of subframes and an adjust factor is less than the noise floor threshold.

4. The method of claim 3, wherein the system further comprises a table in the memory containing pairs of level means entries and gain entries and wherein the steps of causing gain attack further comprise the step of selecting one of the gain entries from the table as an attack level when the total signal level matches one of the level mean entries corresponding to the selected gain entry.

5. An automatic gain controller for a digitized audio signal, comprising:
   a memory comprising a buffer, the buffer comprising a plurality of subframes, each subframe containing digitized data samples of the signal, the subframes including at least one future subframe and a current subframe; and
   signal processing means coupled to the memory for controlling gain of the audio signal represented by the current subframe in the buffer comprising
   means for computing a plurality of mean signal level values from the plurality of subframes, each mean signal level value in the plurality corresponding to one of the subframes;
   means for causing decay of gain on the signal represented by the current subframe when a first set of the mean values are each below a low threshold signal level;

means for causing gain attack on the audio signal represented by the current subframe when a second set of the mean values are each above a high threshold signal level;

means for shifting the data samples in at least one future subframe into the current subframe after causing gain attack or decay for controlling gain of the audio signal;

thereby causing gain attack and decay on the audio signal represented by the subframes which attack and decay appear to occur without delay to a user of the audio signal; and, means for estimating background noise of the signal sample by setting a background noise level value in the memory and adjusting the noise level value to match the lowest of the mean signal level values.

6. An automatic gain controller for a digitized audio signal, comprising:

a memory comprising a buffer, the buffer comprising a plurality of subframes, each subframe containing digitized data samples of the signal, the subframes including at least one future subframe and a current subframe; and signal processing means coupled to the memory for controlling gain of the audio signal represented by the current subframe in the buffer comprising means for computing a plurality of mean signal level values from the plurality of subframes, each mean signal level value in the plurality corresponding to one of the subframes;

means for causing decay of gain on the signal represented by the current subframe when a first set of the mean values are each below a low threshold signal level;

means for causing gain attack on the audio signal represented by the current subframe when a second set of the mean values are each above a high threshold signal level;

means for shifting the data samples in at least one future subframe into the current subframe after causing gain attack or decay for controlling gain of the audio signal;

thereby causing gain attack and decay on the audio signal represented by the subframes which attack and decay appear to occur without delay to a user of the audio signal;

initialization means coupled to the signal processing means for setting an initial signal gain level for the controller and having an attack level setting in the memory;

a decay level setting in the memory;

a desired gain level setting in the memory;

means for increasing the attack level setting by a controlled amount during each of the predetermined initial plurality of subframes processed by the controller; and means for disabling the initialization means when the attack level setting equals or exceeds the desired gain level; and means for estimating background noise of the signal sample by setting a background noise level value in the memory and adjusting the noise level value to match the lowest of the mean signal level values.

7. The controller of claim 6, wherein the initialization means further comprises:

a gain floor level value stored in the memory;

means for detecting valid speech in the signal sample, the detecting means comprising means for:

sensing an input signal level represented by the current subframe;

adjusting the floor level value in response to the input signal level represented by the current subframe; and finding valid speech when a plurality of consecutive subframes each contain signal data having a signal level greater than the sum of the floor level value and an interval level.

8. The controller of claim 6, wherein the signal processing means further comprising means for sensing presence of a valid speech signal data sample in the subframes and dependent thereon, selectively causing gain decay.

9. The controller of claim 7, wherein the means for sensing valid speech further comprises means responsive to absence of a valid speech data sample for adjusting the floor level value in the memory when the mean signal level value in a plurality of subframes and an adjust factor is less than the floor level value.

10. An automatic gain controller for a digitized audio signal, comprising:

a memory comprising a buffer, the buffer comprising a plurality of subframes, each subframe containing digitized data samples of the signal, the subframes including at least one future subframe and a current subframe; and signal processing means coupled to the memory for controlling gain of the audio signal represented by the current subframe in the buffer comprising means for computing a plurality of mean signal level values from the plurality of subframes, each mean signal level value in the plurality corresponding to one of the subframes;

means for causing decay of gain on the signal represented by the current subframe when a first set of the mean values are each below a low threshold signal level;

means for causing gain attack on the audio signal represented by the current subframe when a second set of the mean values are each above a high threshold signal level, said second set comprising a number of subframes determined by a variable spike resistance parameter in the memory; and means for shifting the data samples in at least one future subframe into the current subframe after causing gain attack or decay for controlling gain of the audio signal;

thereby causing gain attack and decay on the audio signal represented by the subframes which attack and decay appear to occur without delay to a user of the audio signal.

11. An automatic gain controller for a voice processing system, the system having a memory, a mass storage device, and at least one digital signal processor coupled to the memory and the mass storage device, the controller comprising:

a buffer in the memory comprising a plurality of subframes organized as a group of future subframes and a current subframe, each subframe containing a digitized signal sample; and data processing means coupled to the memory for recording the samples on the mass storage device after adjusting the gain of the samples, comprising means for computing a mean signal level for each sample in all the subframes;

means for causing gain decay on the signal represented by the current subframe when a signal level of samples in a first set of the subframes is below a low threshold signal level;

means for causing gain attack on the signal represented by the current subframe when a signal level of samples in a second set of the subframes is above a high threshold signal level;

means for shifting the data sample in the current subframe to an output for recording on the mass storage device and for shifting data of one subframe in the future group into the current subframe; and means for estimating background noise of the signal sample by setting a background noise level value in the memory and adjusting the noise level value in response to the lowest of the mean signal level values.

12. An automatic gain controller for a voice processing system, the system having a memory, a mass storage device, and at least one digital signal processor coupled to the memory and the mass storage device, the controller comprising:

a buffer in the memory comprising a plurality of subframes organized as a group of future subframes and a current subframe, each subframe containing a digitized signal sample; and data processing means coupled to the memory for recording the samples on the mass storage device after adjusting the gain of the samples, comprising means for computing a mean signal level for each sample in all the subframes;

means for causing gain decay on the signal represented by the current subframe when a signal level of samples in a first set of the subframes is below a low threshold signal level;

means for causing gain attack on the signal represented by the current subframe when a signal level of samples in a second set of the subframes is above a high threshold signal level;

means for shifting the data sample in the current subframe to an output for recording on the mass storage device and for shifting data of one subframe in the future group into the current subframe;

initialization means coupled to the digital signal processing means for setting an initial gain level of the controller and having an attack level setting in the memory;

a decay level setting in the memory;

a desired gain level setting in the memory;

means for increasing the attack level setting by a controlled amount during processing of each of a predetermined plurality of frames processed by the controller at the start of a frame stream;

means for disabling the initialization means when the attack level setting equals or exceeds the desired gain level; and means for estimating background noise of the signal sample by setting a background noise level value in the memory and adjusting the noise level value in response to the lowest of the mean signal level value.

13. The controller of claim 11 or 12, wherein the initialization means for further comprises:

an initial gain floor level estimate stored in the memory;

means for detecting valid speech in the signal sample comprising means for:

sensing an input signal level of the current subframe;

adjusting the floor level estimate in response to the input signal level of the current subframe; and finding valid speech when a mean signal level of a plurality of consecutive subframes is greater than the sum of the floor level estimate and an interval level.

14. The controller of claim 13, wherein the means for detecting valid speech further comprises means for finding valid speech when a plurality of consecutive subframes each have a signal level above the floor level estimate.

15. The controller of claim 14, wherein the means for sensing valid speech further comprises means responsive to absence of valid speech for adjusting the floor level estimate when the sum of the total signal level of a plurality of subframes and an adjust factor is less than the floor level estimate.

16. The controller of claim 15 wherein the means for causing gain attack further comprises:

a table in the memory containing pairs of mean level entries and gain entries; and means for selecting one of the gain entries from the table as an attack level when the total signal level matches one of the level mean entries corresponding to the selected gain entry.

17. An automatic gain controller for a voice processing system, the system having a memory, a mass storage device, and at least one digital signal processor coupled to the memory and the mass storage device, the controller comprising:

a buffer in the memory comprising a plurality of subframes organized as a group of future subframes and a current subframe, each subframe containing a digitized signal sample; and data processing means coupled to the memory for recording the samples on the mass storage device after adjusting the gain of the samples, comprising means for computing a mean signal level for each sample in all the subframes;

means for causing gain decay on the signal represented by the current subframe when a signal level of samples in a first set of the subframes is below a low threshold signal level;

means for causing gain attack on the signal represented by the current subframe when a signal level of samples in a second set of the subframes is above a high threshold signal level said second set comprising a number of subframes determined by a variable spike resistance parameter in the memory; and means for shifting the data sample in the current subframe to an output for recording on the mass storage device and for shifting data of one subframe in the future group into the current subframe.

18. A method for automatic gain control of digitized voice samples processed by a voice processing system having a memory, a digital signal processor coupled to the memory for executing the control program, and a buffer in the memory comprising a plurality of sample subframes organized as a group of future subframes and a current subframe; the method comprising the steps of:

computing the total signal level of signals represented by all the subframes;

causing gain decay on the signal represented by current subframe when a signal level of a first set of the subframes is below a low threshold signal level;

causing gain attack on the signal represented by the current subframe when a signal level of a second set of the subframes is above a high threshold signal level;

shifting the signal represented by the current subframe to an output for recording on the mass storage device and for shifting data of one subframe in the future group into the current subframe; and estimating background noise of the signal sample by setting a background noise level value in the memory and adjusting the noise level value in response to the lowest of the signal levels of a plurality of subframes.

19. A method for automatic gain control of an audio signal using a data processing system having a memory comprising a buffer, the buffer comprising a plurality of subframes, each subframe containing a digitized data sample of an audio signal, the subframes including at least one future subframe and a current subframe, the method comprising the steps of:

computing a plurality of mean signal level values from the plurality of subframes, each mean value in the plurality corresponding to one of the subframes;

causing gain decay on the signal represented by the current subframe when a first set of the mean values are each below a low threshold signal level;

causing gain attack on the signal represented by the current subframe when a second set of the mean values are each above a high threshold signal level; and shifting the data samples in at least one future subframe into the current subframe for controlling gain of the audio signal after causing gain attack or decay, thereby causing gain attack and decay on the audio signal represented by the subframes which attack and decay appear to occur without delay to a user of the audio signal, and estimating background noise of the signal sample by setting a noise level value in the memory and adjusting the noise level value in response to the lowest signal level of a plurality of the subframes.

20. A method for automatic gain control of the audio signal using a data processing system having a memory comprising a buffer, the buffer comprising a plurality of subframes, each subframe containing a digitized data sample of an audio signal, the subframes including at least one future subframe and a current subframe, the method comprising the steps of:

computing a plurality of mean signal level values from the plurality of subframes, each mean value in the plurality corresponding to one of the subframes;

causing gain decay on the signal represented by the current subframe when a first set of the mean values are each below a low threshold signal level;

causing gain alack on the signal represented by the current subframe when a second set of the mean values are each above a high threshold signal level; and shifting the data samples in at least one future subframe into the current subframe for controlling gain of the audio signal after causing gain attack or decay, thereby causing gain attack and decay on the audio signal represented by the subframes which attack and decay appear to occur without delay to a user of the audio signal, initializing an initial gain level, the initialization steps being coupled to an attack level setting, a decay level setting, and a desired gain level setting in the memory, the initialization steps comprising setting the attack level very low and setting the decay level to very fast, increasing the attack level setting by a small controlled amount during each of a predetermined initial plurality of frames, and disabling the initialization steps when the attack level setting equals or exceeds the desired gain level; and estimating background noise of the signal sample by setting a noise level value in the memory and adjusting the noise level value in response to the lowest signal level of a plurality of the subframes.

21. The method of claim 19, wherein the initialization steps further comprise steps for detecting valid speech in the signal sample by sensing an input signal level of the current subframe, adjusting the noise level value in response to the input signal level of the current subframe, and finding valid speech when a plurality of consecutive subframes each have a signal level greater than the sum of the noise level value and an interval level.

22. The method of claim 21, further comprising steps for detecting the presence of a valid speech data sample in the subframes when a plurality of consecutive subframes each have a signal level above an absolute threshold value stored in the memory.

23. The method of claim 22, wherein the step of detecting valid speech further comprises steps for responding to absence of a valid speech data sample by for adjusting the floor threshold value in the memory when the mean signal level value in a plurality of subframes and an adjust factor is less than the floor threshold value.

24. The method of claim 23, wherein the memory contains a table containing pairs of corresponding level mean entries and gain entries, and wherein the step of causing gain attack further comprises the substep of selecting one of the gain entries from the table when the total signal level matches one of the level mean entries corresponding to the selected gain entry, and controlling the step of causing gain attack in accordance with the selected gain entry.

25. A method for automatic gain control of the audio signal using a data processing system having a memory comprising a buffer, the buffer comprising a plurality of subframes, each subframe containing a digitized data sample of an audio signal, the subframes including at least one future subframe and a current subframe, the method comprising the steps of:

computing a plurality of mean signal level values from the plurality of subframes, each mean value in the plurality corresponding to open of the subframes;

causing gain decay on the signal represented by the current subframe when a first set of the mean values are each below a low threshold signal level;

causing gain attack on the signal represented by the current subframe when a second set of the mean values are each above a high threshold signal level; and shifting the data samples in at least one future subframe into the current subframe for controlling gain of the audio signal after causing gain attack or decay, thereby causing gain attack and decay on the audio signal represented by the subframes which attack and decay appear to occur without delay to a user of the audio signal, and setting a variable spike resistance parameter in the memory for configuring the number of subframes in the second set.

* * * * *

UNITED STATES PATENT AND TRADEMARK OFFICE
CERTIFICATE OF CORRECTION

PATENT NO. : 5,267,322  
DATED : November 30, 1993  
INVENTOR(S) : Shawn W. Smith; Mark Cromack It is certified that error appears in the above-indentified patent and that said Letters Patent is hereby corrected as shown below:

On title page, item

[56] References Cited, U.S. PATENT DOCUMENTS, change "4,785,352 11/1988 Borrowes et al..358/174" to -- 4,785,352 11/1988 Burrowes et al..358/174 --.

Column 3, line 31, after "appreciate" change "an" to -- a --.
Column 3, line 67, change "systems" to -- system --.

Column 4, line 39, before "interface" change "this" to -- with the --.

Column 5, line 49, after "processor" insert -- (DSP). The DSP preferable is the TMS320C25 available from --.
Column 5, line 63, change "bus 59" to -- bus 59' --.

Column 6, line 54, after "communications" change "is" to -- are --.
Column 6, line 63, change "8 KHz" to -- 8 kHz --.

Column 7, line 3, change "8 Khz" to -- 8 kHz --.

UNITED STATES PATENT AND TRADEMARK OFFICE
CERTIFICATE OF CORRECTION

PATENT NO. : 5,267,322
DATED : November 30, 1993
INVENTOR(S) : Shawn W. Smith; Mark Cromack It is certified that error appears in the above-indentified patent and that said Letters Patent is hereby corrected as shown below:

Column 8, line 31, after "signal data" insert a period.
Column 8, line 32, after "FIG. 2B(1)" insert a period.

Column 10, line 50, change "aG_SSHIFT)" to
 -- AG_SSHIFT) --.

Column 11, line 50, change "35" to -- -35 --.

Column 12, line 13, change "to not be" to
 -- not to be --.
Column 12, line 15, before "invention" delete "the".
Column 12, line 32, change "hueristics" to
 -- heuristics --.
Column 12, line 36, change "mSec" to -- msec --.
Column 12, line 38, change "104,6" to -- 104, 106 --.
Column 12, line 66, change "n+1" to -- n --.

Column 13, lines 55,56, change "T h e" to -- The --.

UNITED STATES PATENT AND TRADEMARK OFFICE
CERTIFICATE OF CORRECTION

PATENT NO. : 5,267,322
DATED : November 30, 1993
INVENTOR(S) : Shawn W. Smith; Mark Cromack It is certified that error appears in the above-indentified patent and that said Letters Patent is hereby corrected as shown below:

In the Claims:

Column 19, line 66, before "further" delete "for".

Column 21, line 60, after "causing gain" change "alack" to -- attack --.

Column 22, line 34, after "sample by" delete "for".
Column 22, line 58, after "corresponding to" change "open" to -- one --.

Signed and Sealed this

Eighteenth Day of October, 1994

Attest:

BRUCE LEHMAN

Attesting Officer    Commissioner of Patents and Trademarks

UNITED STATES PATENT AND TRADEMARK OFFICE
CERTIFICATE OF CORRECTION

PATENT NO. : 5,267,322

DATED : November 30, 1993

INVENTOR(S) : Shawn W. Smith; Mark Cromack

Page 1 of 2

It is certified that error appears in the above-indentified patent and that said Letters Patent is hereby corrected as shown below:

On the Title Page

[56] References Cited, U.S. PATENT DOCUMENTS, change "4,785,352  11/1988 Borrowes et al..358/174" to -- 4,785,352 11/1988 Burrowes et al..358/174 --.

Column 3, line 31, after "appreciate" change "an" to -- a --.
Column 3, line 67, change "systems" to -- system --.
Column 4, line 39, before "interface" change "this" to -- with the --.
Column 5, line 49, after "processor" insert -- (DSP). The DSP preferable is the TMS320C25 available from --.
Column 5, line 63, change "bus 59" to -- bus 59' --.
Column 6, line 54, after "communications" change "is" to -- are --.
Column 6, line 63, change "8 KHz" to -- 8 kHz --.
Column 7, line 3, change "8 Khz" to -- 8 kHz --.
Column 8, line 31, after "signal data" insert a period.
Column 8, line 32, after "FIG. 2B(1)" insert a period.
Column 10, line 50, change "aG_SSHIFT)" to -- AG_SSHIFT) --.
Column 11, line 50, change "35" to -- -35 --.

UNITED STATES PATENT AND TRADEMARK OFFICE
CERTIFICATE OF CORRECTION

PATENT NO. : 5,267,322

DATED : November 30, 1993

INVENTOR(S) : Shawn W. Smith; Mark Cromack

It is certified that error appears in the above-indentified patent and that said Letters Patent is hereby corrected as shown below:

```
Column 12, line 13, change "to not be" to
          -- not to be --.
Column 12, line 15, before "invention" delete "the".
Column 12, line 32, change "hueristics" to
          -- heuristics --.
Column 12, line 36, change "mSec" to -- msec --.
Column 12, line 38, change "104,6" to -- 104, 106 --.
Column 12, line 66, change "n+1" to -- n --.
Column 13, lines 55,56, change "T h e" to -- The --.

Column 19, line 66, before "further" delete "for".
Column 21, line 60, after "causing gain" change "alack"
          to -- attack --.
Column 22, line 34, after "sample by" delete "for".
Column 22, line 58, after "corresponding to" change
          "open" to -- one --.
```

Signed and Sealed this

Fifteenth Day of November, 1994

Attest:

BRUCE LEHMAN

*Attesting Officer*        *Commissioner of Patents and Trademarks*